(12) United States Patent
Radomski et al.

(10) Patent No.: US 10,546,724 B2
(45) Date of Patent: Jan. 28, 2020

(54) PULSED, BIDIRECTIONAL RADIO FREQUENCY SOURCE/LOAD

(71) Applicant: MKS Instruments, Inc., Andover, MA (US)

(72) Inventors: Aaron T. Radomski, Conesus, NY (US); Ky Luu, Victor, NY (US); Larry J. Fisk, II, Fairport, NY (US); Ross Reinhardt, Rochester, NY (US); Matthew G. Harrington, Rochester, NY (US); Amish Rughoonundon, Pittsford, NY (US); Jesse N. Klein, West Henrietta, NY (US); Aaron M. Burry, Ontario, NY (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 15/974,947

(22) Filed: May 9, 2018

(65) Prior Publication Data
US 2018/0330921 A1   Nov. 15, 2018

Related U.S. Application Data

(60) Provisional application No. 62/504,197, filed on May 10, 2017.

(51) Int. Cl.
*H05B 33/00* (2006.01)
*H01J 37/32* (2006.01)
(Continued)

(52) U.S. Cl.
CPC ...... *H01J 37/321* (2013.01); *H01J 37/32183* (2013.01); *H01L 21/3065* (2013.01); *H05H 1/46* (2013.01)

(58) Field of Classification Search
CPC .......... H01J 37/32165; H01J 37/32091; H01J 37/3244; H01J 37/32449; H01J 37/32862;
(Continued)

(56) References Cited

U.S. PATENT DOCUMENTS 6,469,919 B1   10/2002   Bennett
6,618,276 B2   9/2003    Bennett
(Continued)

FOREIGN PATENT DOCUMENTS

JP   2000003903 A   1/2000
JP   2004140391 A   5/2004
TW   201709774 A    3/2017

OTHER PUBLICATIONS

Taiwan Office Action and Search Report dated Jun. 12, 2019 for Application No. 107115985, and its English translation thereof.
(Continued)

*Primary Examiner* — Monica C King
(74) *Attorney, Agent, or Firm* — Harness, Dickey & Pierce, P.L.C.

(57) ABSTRACT

A radio frequency power system includes a master RF generator and an auxiliary RF generator, wherein each generator outputs a respective RF signal. The master RF generator also outputs a RF control signal to the auxiliary RF generator, and the RF signal output by the auxiliary RF generator varies in accordance with the RF control signal. The auxiliary RF generator receives sense signals indicative of an electrical characteristic of the respective RF signals output by the master RF generator and the auxiliary RF generator. The auxiliary RF generator determines a phase difference between the RF signals. The sensed electrical characteristics and the phase are used independently or cooperatively to control the phase and amplitude of the RF signal output by the auxiliary RF generator. The auxiliary
(Continued)

generator includes an inductive clamp circuit that returns energy reflected energy back from a coupling network to a variable resistive load.

47 Claims, 19 Drawing Sheets

(51) Int. Cl.
*H01L 21/3065* (2006.01)
*H05H 1/46* (2006.01)
(58) Field of Classification Search
CPC .......... H01J 37/32009; H01J 37/32174; H01J 37/32183; H01J 37/321; H01J 49/0018; H01J 2237/04737; H01J 2237/31701; H01J 2237/334; H01J 2237/3343; H01J 2237/3348; H01J 37/04; H01J 37/304; H01J 37/32082; H01J 37/32137; H01J 37/32146; H01J 37/32532; H01J 37/32706; H01J 37/32926; H01J 37/3299; H01J 49/004; H01J 49/022; H01J 49/424; H01J 37/32155; H01J 37/32412; H01J 37/32587; H01J 37/32779; H01J 37/32935; H01J 49/02; H01J 49/38; H01J 49/4285; H01J 49/429; H05B 6/806
See application file for complete search history.

(56) References Cited

U.S. PATENT DOCUMENTS

| | | | |
|---|---|---|---|
| 6,707,255 B2 | 3/2004 | Coumou et al. | |
| 6,885,567 B2 | 4/2005 | Lincoln et al. | |
| 7,180,758 B2 | 2/2007 | Lincoln et al. | |
| 7,397,676 B2 | 7/2008 | Lincoln et al. | |
| 7,602,127 B2 | 10/2009 | Coumou | |
| 7,758,764 B2 | 7/2010 | Dhindsa et al. | |
| 8,110,991 B2 | 2/2012 | Coumou | |
| 8,395,322 B2 | 3/2013 | Coumou | |
| 8,563,619 B2 | 10/2013 | Dhindsa et al. | |
| 9,336,995 B2 | 5/2016 | Coumou et al. | |
| 9,408,288 B2 | 8/2016 | Valcore, Jr. et al. | |
| 9,536,749 B2 | 1/2017 | Marakhtanov et al. | |
| 2008/0308410 A1 | 12/2008 | Teschner et al. | |
| 2014/0023821 A1 | 1/2014 | Kwon et al. | |
| 2014/0203821 A1 | 7/2014 | Yamamoto et al. | |
| 2016/0117425 A1* | 4/2016 | Povolny | G06F 17/5036 703/13 |
| 2016/0177425 A1 | 6/2016 | Go et al. | |
| 2017/0062186 A1 | 3/2017 | Coumou et al. | |

OTHER PUBLICATIONS

Rowell, Derek. "State-Space Representation of LTI Systems." Analysis and Design of Feedback Control Systems, vol. 2, No. 14, 2002, pp. 1-18.
International Search Report and Written Opinion for International Patent App. No. PCT/US2018/032067 dated Sep. 21, 2018.
Notification Concerning Transmittal of International Preliminary Report on Patentability dated Nov. 21, 2019, International Report on Patentability dated Nov. 12, 2019, and Written Opinion of the International Searching Authority dated Sep. 21, 2019 for PCT Patent App. No. PCT/US2018/032067.

* cited by examiner

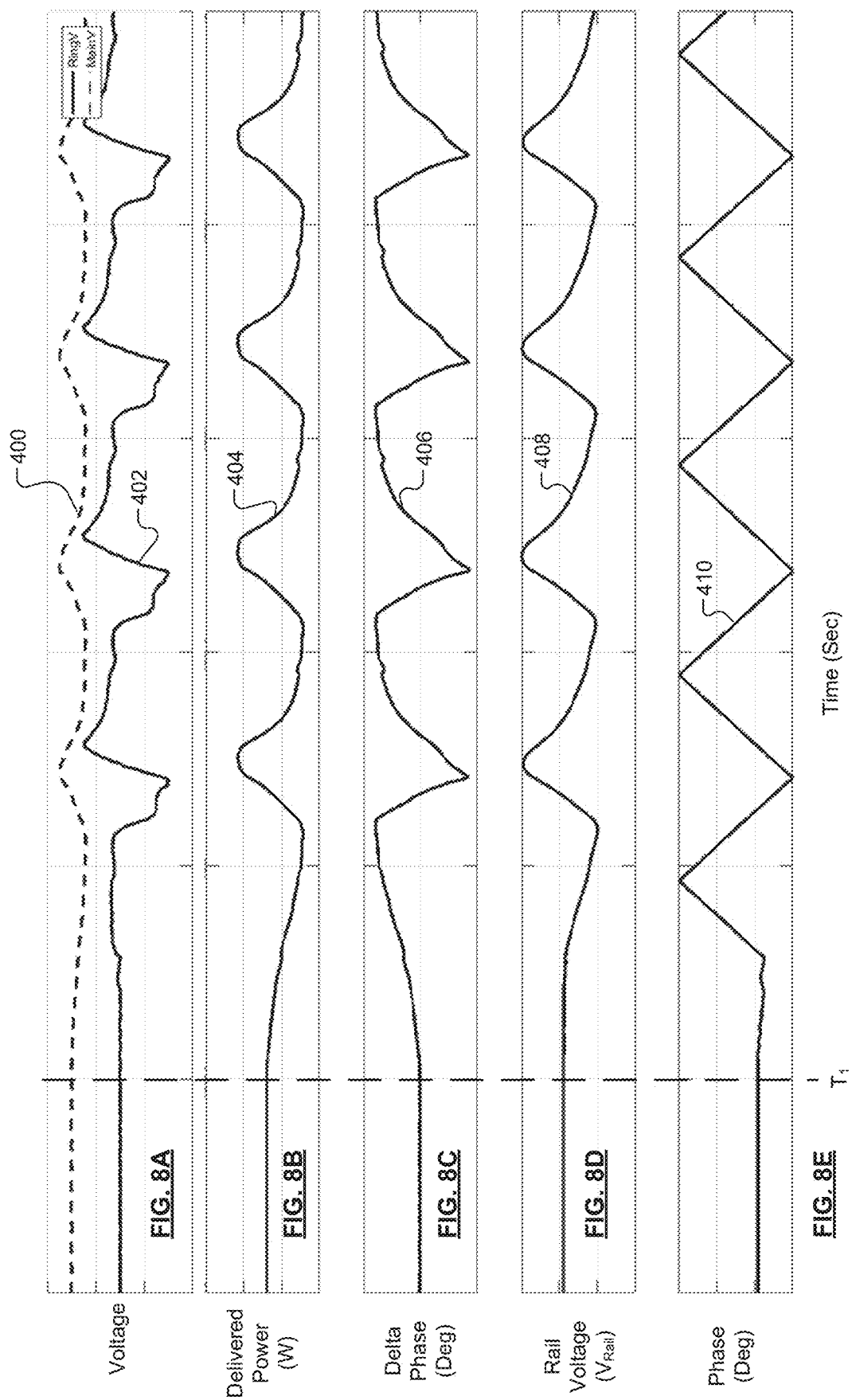

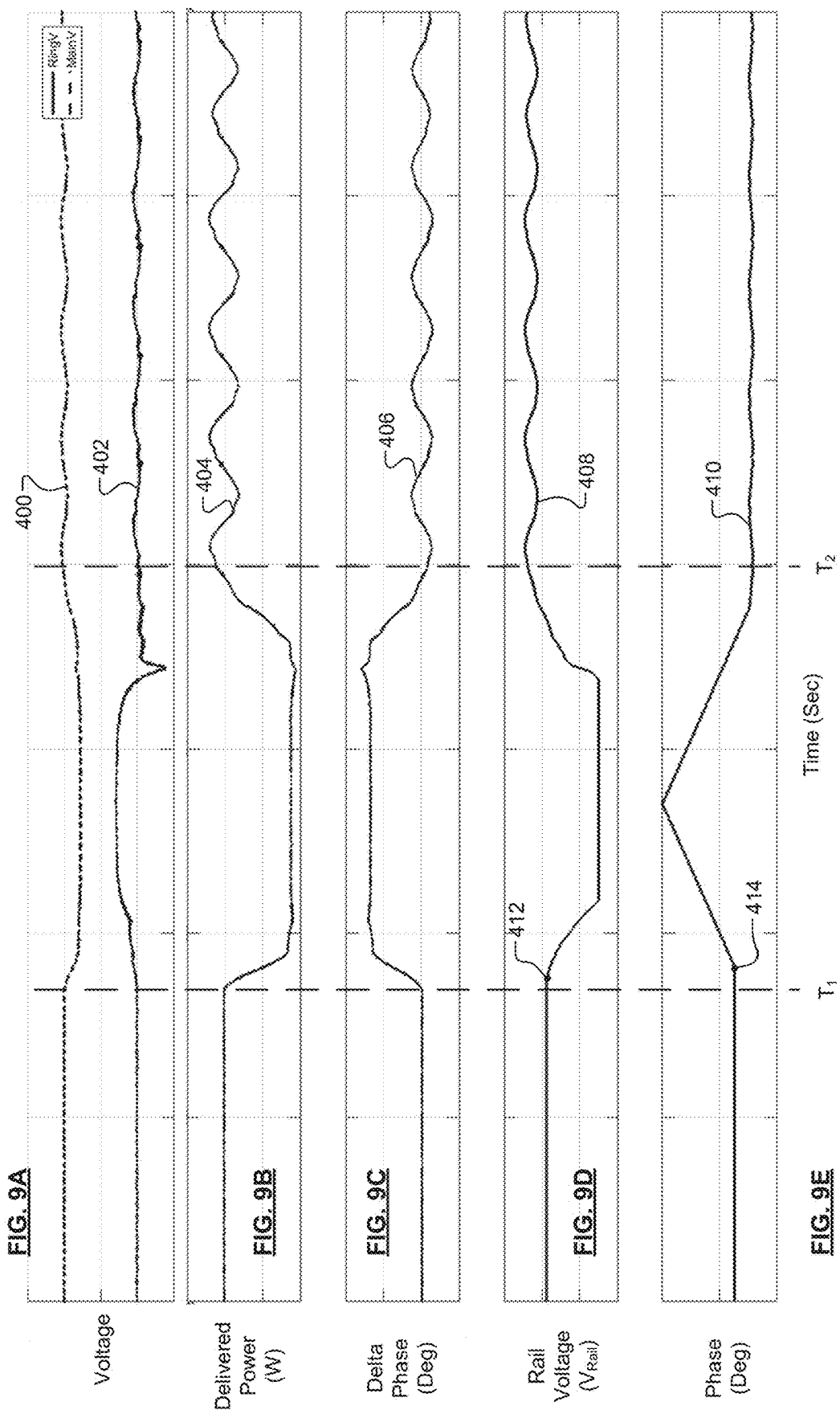

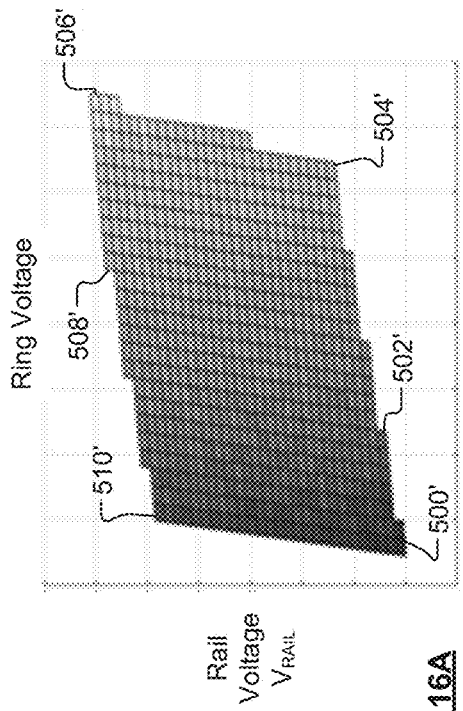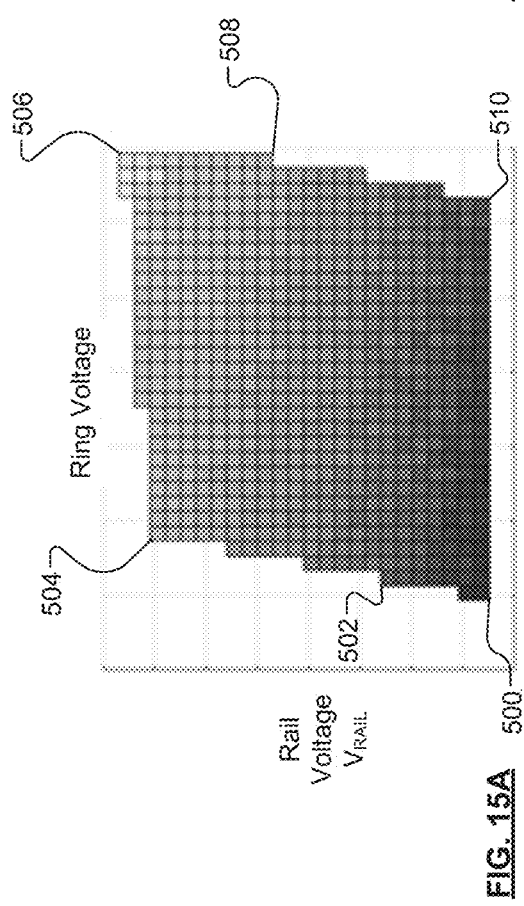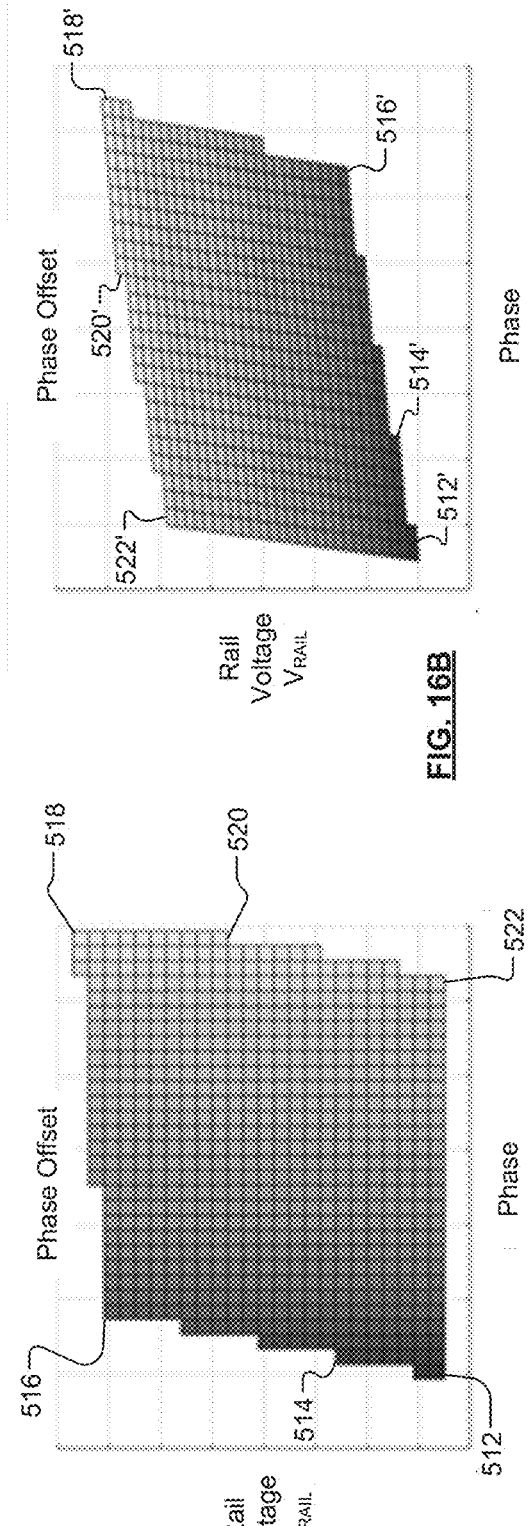

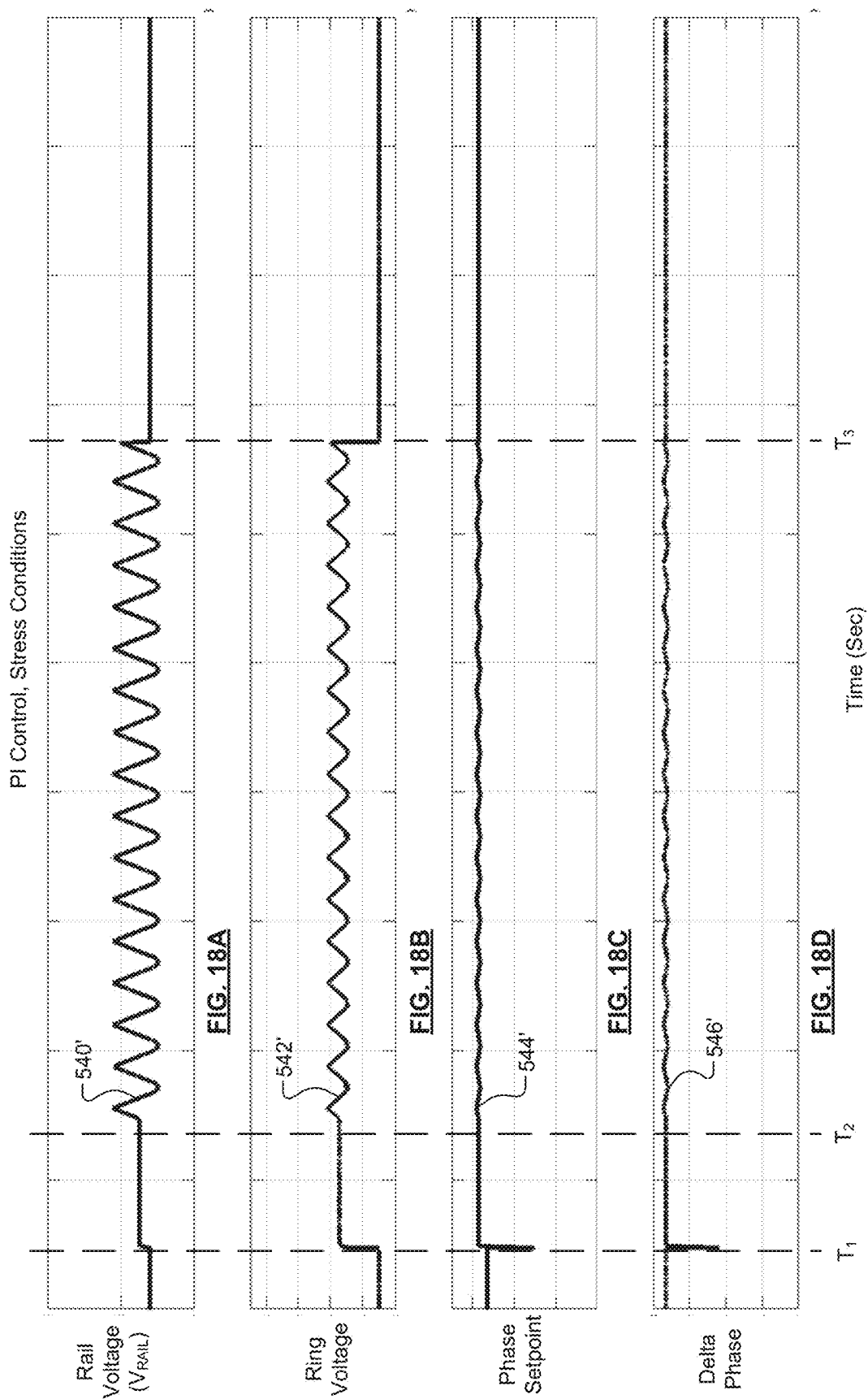

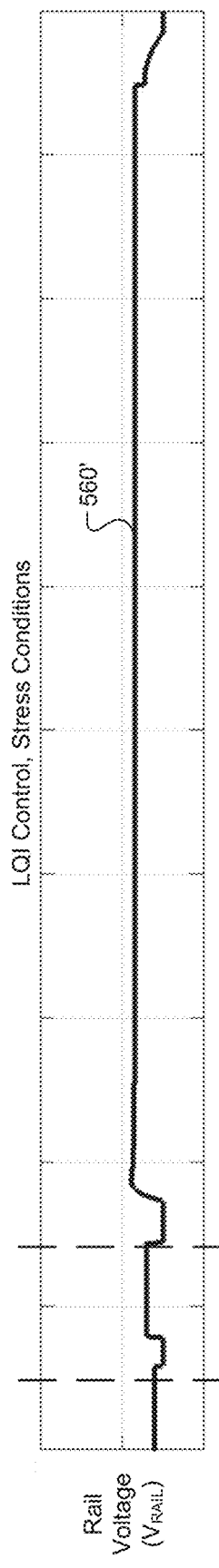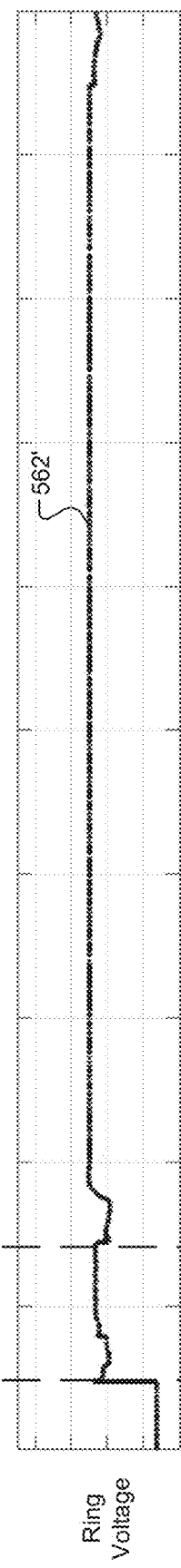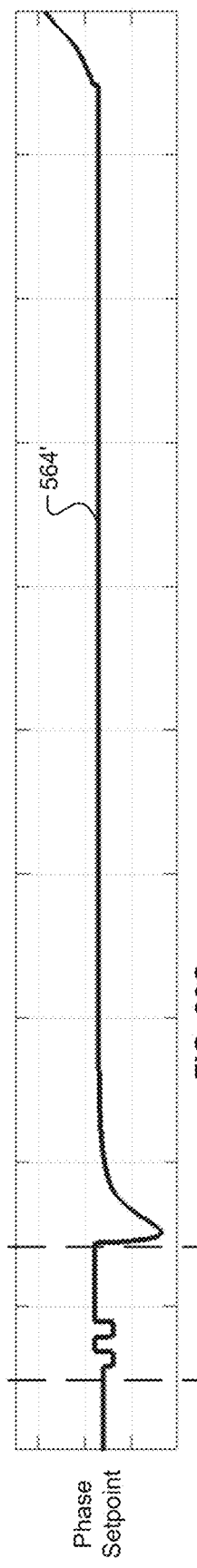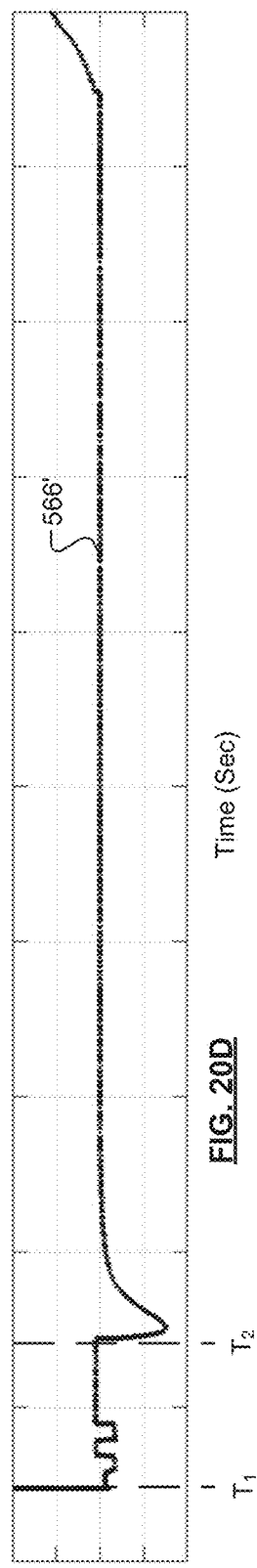
FIG. 20A
FIG. 20B
FIG. 20C
FIG. 20D

PULSED, BIDIRECTIONAL RADIO FREQUENCY SOURCE/LOAD

CROSS REFERENCE TO RELATED APPLICATIONS

This application claims the benefit of U.S. Provisional Application No. 62/504,197, filed on May 10, 2017. The entire disclosure of the above application is incorporated herein by reference.

FIELD

The present disclosure relates to controlling RF generators and dissipating reflected energy from a variable impedance load.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Plasma etching is frequently used in semiconductor fabrication. In plasma etching, ions are accelerated by an electric field to etch exposed surfaces on a substrate. The electric field is generated based on RF power signals generated by a radio frequency (RF) generator of a RF power system. The RF power signals generated by the RF generator must be precisely controlled to effectively execute plasma etching.

A RF power system may include a RF generator or supply, a matching or match network, and a load (e.g., a plasma chamber). The RF generator generates RF power signals, which are received at the matching network. The matching network matches an input impedance of the matching network to a characteristic impedance of a transmission line between the RF generator and the matching network. This impedance matching aids in maximizing an amount of power forwarded to the matching network ("forward power") and minimizing an amount of power reflected back from the matching network to the RF generator ("reverse power"). Forward power may be maximized and reverse power may be minimized when the input impedance of the matching network matches the characteristic impedance of the transmission line.

In the RF power generator or supply field, there are typically two approaches to applying the RF signal to the load. A first, more traditional approach is to apply a continuous wave signal to the load. In a continuous wave mode, the continuous wave signal is typically a sinusoidal wave that is output continuously by the power source to the load. In the continuous wave approach, the RF signal may be a sinusoidal output, and the amplitude and/or frequency of the sinusoidal wave can be varied in order to vary the output power applied to the load.

A second approach to applying the RF signal to the load involves pulsing the RF signal, rather than applying a continuous wave signal to the load. In a pulse mode of operation, a RF sinusoidal signal is modulated by a modulation signal in order to define an envelope for the modulated sinusoidal signal. In a conventional pulse modulation scheme, the RF sinusoidal signal typically is output at a predetermined frequency and amplitude. The frequency can be varied to improve impedance match conditions, providing agile frequency tuning. Amplitude may be varied to change the power of the RF signal. Power delivered to the load may also be controlled by varying the modulation signal, in addition to or rather than varying the sinusoidal, RF signal.

In a typical RF power generator configuration, output power applied to the load is determined using sensors that measure the forward and reflected power or the voltage and current of the RF signal applied to the load. Either set of these signals is analyzed to determine the parameters or electrical characteristics of the power applied to the load. The parameters can include, for example, voltage, current, frequency, and phase. The analysis may determine a power value which is used to adjust the output of the RF power supply in order to vary the power applied to the load. In a RF power delivery system, where the load is a plasma chamber, the varying impedance of the load causes a corresponding varying power applied to the load, as applied power is partially a function of the impedance of the load. Therefore, the varying impedance can necessitate varying the parameters of the power applied to the load in order to maintain optimum application of power from the RF power supply to the load.

In plasma systems, power is typically delivered in one of two configurations. In a first configuration, the power is capacitively coupled to the plasma chamber. Such systems are referred to as capacitively coupled plasma (CCP) systems. In a second configuration, the power is inductively coupled to the plasma chamber. Such systems are typically referred to as inductively coupled plasma (ICP) systems. Plasma delivery systems typically include a bias and a source that apply respective bias power and source power to one or a plurality of electrodes. The source power typically generates a plasma within the plasma chamber, and the bias power tunes the plasma to an energy relative to the bias RF power supply. The bias and the source may share the same electrode or may use separate electrodes, in accordance with various design considerations.

When a RF power delivery system drives a load in the form of a plasma chamber, the electric field generated by the power delivered to the plasma chamber results in ion energy within the chamber. One characteristic measure of ion energy is the ion energy distribution function (IEDF). The ion energy distribution function (IEDF) can be controlled with a RF waveform. One way of controlling the IEDF for a system in which multiple RF power signals are applied to the load occurs by varying multiple RF signals that are related by frequency and phase. The frequencies between the multiple RF power signals are locked, and the relative phase between the multiple RF signals is also locked. Examples of such systems can be found with reference to U.S. Pat. Nos. 7,602,127; 8,110,991; 8,395,322; and 9,336,995 assigned to the assignee of the present invention and incorporated by reference in this application.

RF plasma processing systems include components for plasma generation and control. One such component is referred to as a plasma chamber or reactor. A typical plasma chamber or reactor utilized in RF plasma processing systems, such as by way of example, for thin-film manufacturing, utilizes a dual frequency system. One frequency (the source) of the dual frequency system controls the generation of the plasma, and the other frequency (the bias) of the dual frequency system controls ion energy. Examples of dual frequency systems include systems that are described in U.S. Pat. Nos. 7,602,127; 8,110,991; 8,395,322; and 9,336,995 referenced above. The dual frequency systems described in the above-referenced patents include a closed-loop control system to adapt RF power supply operation for the purpose of controlling ion density and its corresponding IEDF.

The demand on plasma processing accuracy continues to increase. Tighter tolerances are being required of plasma-based fabrication systems, including decreasing component size, increasing density, both of which require greater accuracy from the plasma-based fabrication processes. Further challenges exist in connection with three dimensional integrated circuit and memory fabrication processes. One approach to significantly increasing the density of memory components is to fabricate memory components in a three dimensional structure. Three dimensional etching requires tight tolerances to direct ions to carry out the fabrication process. Some three dimensional etching processes require a 40:1 or greater aspect ratio. That is, the channel holes etched can be at least forty times taller than wide. In order to properly etch to these tolerances, it is necessary to direct ions at the wafer under fabrication in a substantially orthogonal direction, or directly at the workpiece wafer under fabrication, to provide sufficient yields. Other applications that require similarly accurate directivity of the ions at a substantially orthogonal direction to the wafer include solar or flat panel display fabrication and multiple electrode plasma fabrication systems.

Further complicating the control of plasma-based fabrication process is that the distribution of electrical power across the surface of a wafer may not be uniform. The electric field or electrical power near the edges of a workpiece or wafer may vary relative to the electrical power or fields away from the edges of the wafer. This variation can cause the ions to move in a direction less orthogonal to, or more across, the wafer, thereby making it difficult to meet the tolerances required for efficient fabrication, such as for three dimensional structures. One approach to improving the directivity of the ions near the edge of the wafer places a secondary electrode, sometimes referred to as an auxiliary electrode, near the edge of the wafer to provide a supplemental electrical field near the edge of the wafer. The secondary electrode can be powered independently by a separate RF generator and enables the tuning of the electrical power and field near the edge of the wafer, thereby enabling an increased control of the angle of incidence of the ions upon the wafer.

Present methods of providing RF power to the auxiliary electrode include passive reactive termination of the auxiliary electrode, such as with a variable capacitor. Other methods include using a slave or secondary RF generator operating in phase lock loop with respect to a master or primary RF generator. In a pulsed implementation, however, these methods may not provide the desired directivity of the ions in the plasma based fabrication system.

SUMMARY

A RF system includes a first RF generator connected to a first electrode of a load and generating a first RF signal to the first electrode and a second RF generator connected to a second electrode of a load and generating a second RF signal to the second electrode. The first and second RF generators provide a respective RF voltage to the first and second electrodes. A controller controls the second RF generator. The controller generates a control signal to at least one of the first RF generator or the second RF generator. The first RF generator and the second RF generator operate at substantially a same frequency in accordance with a RF control signal communicated from the first RF generator to the second RF generator.

A RF power system for supplying a first RF power to an electrode in a load includes a processor and a memory. The memory stores instructions executable by the processor and is configured to determine whether a voltage of the first RF power equals a predetermined power setpoint. The instructions also determine whether a phase difference between the first RF power and a second RF power equals a predetermined phase delta, and control at least one of a phase of the first RF power in accordance with the phase difference between the first RF power and a second RF power. The instructions also vary a DC rail voltage in order to control a RF voltage of the first RF power in accordance with an electrical characteristic of the first RF power, or vary a phase of the first RF power and a DC rail voltage in order to control the first RF power in accordance with both the phase difference between first RF power and the second RF power and the electrical characteristic of the first RF power.

A RF system includes a first RF generator connected to a first electrode of a load and generates a first RF signal to the first electrode. A second RF generator connects to a second electrode of the load and generates a second RF signal to the second electrode. A controller controls the second RF generator and the controller generates a control signal to at least one of the first RF generator or the second RF generator. A DC power supply provides a DC rail voltage for driving a power amplifier of the second RF generator, wherein the controller varies the DC rail voltage in order to control a RF voltage at the second electrode. The first RF generator and the second RF generator operate at substantially a same RF frequency, and the controller is configured to at least one of (1) vary a phase of second RF signal in accordance with a phase difference between the first RF signal and the second RF signal, (2) and vary a DC rail voltage to control a RF voltage at the second electrode in accordance with an electrical characteristic of the second RF signal, wherein a DC power supply provides the DC rail voltage for driving a power amplifier of the second RF generator, or (3) vary a phase of the second RF signal and a DC rail voltage to control the RF voltage at the second electrode, wherein a DC power supply provides the DC rail voltage for driving the power amplifier of the second RF generator, in accordance with both the phase difference between first RF signal and the second RF signal and the electrical characteristic of the second RF signal.

A method of operating a RF power system, the method includes generating a first RF signal applied to a first electrode of a load. A second RF signal is applied to a second electrode of the load. A DC rail voltage drives a power amplifier generating the second RF signal and vary the DC rail voltage in order to control a RF voltage at the second electrode. The method further includes at least one of (1) varying a phase of the second RF signal in accordance with a phase difference between the first RF signal and the second RF signal, (2) varying a DC rail voltage to control a RF voltage at the second electrode in accordance with an electrical characteristic of the second RF signal, wherein the DC rail voltage drives a power amplifier generating the second RF signal, or (3) varying a phase of the second RF signal and the DC rail voltage in order to control the RF voltage at the second electrode, wherein the DC rail voltage powers the power amplifier, in accordance with both the phase difference between first RF signal and the second RF signal and the electrical characteristic of the second RF signal.

A radio frequency power system is provided that includes a master RF generator and an auxiliary RF generator, wherein each generator outputs a respective RF signal. The master RF generator also outputs a RF control signal to the auxiliary RF generator, and the RF signal output by the auxiliary RF generator varies in accordance with the RF control signal. The master RF generator also generates a pulse synchronization signal input to the auxiliary RF generator to vary pulsing of the RF signal output by the auxiliary RF generator.

In other features, the auxiliary RF generator receives sense signals indicative of electrical characteristics of the respective RF signals output by the master RF generator and the auxiliary RF generator.

In other features, the auxiliary RF generator determines a phase difference between the RF signals output by the respective RF generators in accordance with the sense signals and generates a request to the master RF generator to vary the RF control signal in accordance with the phase difference.

In other features, the auxiliary RF generator includes power amplifiers including voltage clamping circuits that return energy reflected from a coupling network to a variable resistive load. The variable resistive load dissipates the reflected energy in accordance with a command signal that varies the resistance of the variable resistive load.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 8A-8E are waveforms of selected electrical characteristics of an exemplary RF power system depicting an oscillation under selected conditions;

FIGS. 9A-9E are waveforms of selected electrical characteristics of an exemplary RF power system during transition of settings of a match network;

FIGS. 15A-15B are plots of selected electrical characteristics of a RF power system operating under nominal conditions;

FIGS. 16A-16B are plots of selected electrical characteristics of a RF power system in which the response surfaces have been rotated under stress conditions;

FIGS. 18A-18D are plots of selected electrical characteristics of a RF power system controlling a single input for a selected output operating under stress conditions;

FIGS. 20A-20D are plots of selected electrical characteristics of a RF power system under nominal conditions controlled using the control system of FIG. 14;

In the drawings, reference numbers may be reused to identify similar and/or identical elements.

DETAILED DESCRIPTION

Figure 1:
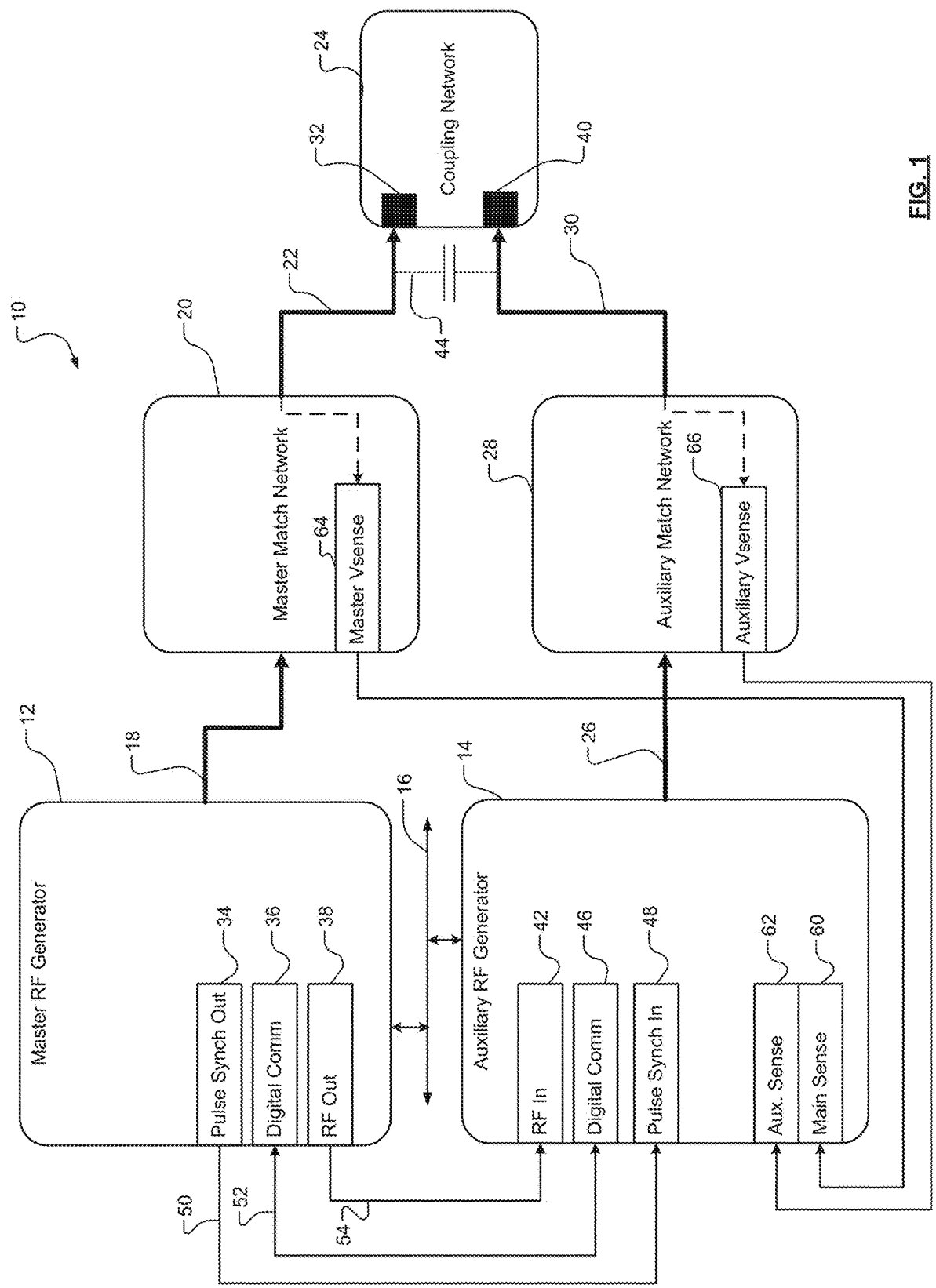
FIG. 1 is a schematic and functional block diagram of a radio frequency (RF) power system according to various embodiments.

FIG. 1 depicts a schematic and functional block diagram of RF power system 10. RF power system 10 includes a master RF generator 12 and an auxiliary RF generator 14. Master RF generator 12 generates a master RF signal 18 input to master matching or match network 20. Master match network 20 varies an impedance between master RF generator 12 and coupling network 24 in order to achieve an impedance match between master RF generator 12 and coupling network 24 so that maximum power is transferred from master RF generator 12 to coupling network 24. Similarly, auxiliary RF generator 14 generates an auxiliary RF signal or output 26 to auxiliary matching or match network 28. Auxiliary match network 28 varies an impedance between auxiliary RF generator 14 and coupling network 24 to provide an impedance match between auxiliary RF generator 14 and coupling network 24 to maximize power transfer from auxiliary RF generator 14 to coupling network 24. In various embodiments, a direct current (DC) bus 16 provides DC voltage to one or both of master RF generator 12 and auxiliary RF generator 14.

Master match network 20 outputs a master matched RF signal 22 to coupling network 24. Auxiliary match network 28 outputs an auxiliary matched RF signal 30 to coupling network 24. In various embodiments, auxiliary match network 28 may have an external input (not shown). In various embodiments the external input receives an external signal that controls the position of one or a plurality of capacitive components of auxiliary match network 28 to vary the impedance of auxiliary match network 28. Master matched RF signal 22 and auxiliary matched RF signal 30, in various embodiments, can communicate with the same or separate electrodes of coupling network 24. In various embodiments, master matched RF signal 22 is applied to a master electrode 32 of a coupling network 24, and auxiliary matched RF signal 30 is applied to an auxiliary electrode 40 of coupling network 24. In various embodiments, main electrode 32 and auxiliary electrode 40 are capacitively coupled, as indicated by capacitor 44, shown in phantom to indicate the capacitive aspect of the coupling. In various embodiments, coupling network 24 can be a plasma chamber, plasma reactor, or other load.

Throughout the specification, RF power system 10 can be considered as having components associated with a master portion of the RF power system 10 and components associated with an auxiliary portion of the RF power system 10. Components associated with the master portion may be referred to as master, main, first, or primary components. Components associated with the auxiliary portion of RF power system 10 may be referred to as auxiliary, slave, secondary, or second components.

Master matched RF signal 22 and auxiliary matched RF signal 30 cooperate to generate a reaction within coupling network 24. In various embodiments, master RF generator 12 generates a 100 kHz-2 MHz RF output signal and may commonly be referred to as a bias RF generator. The bias RF generator typically accelerates positive ions from the plasma to the substrate surface to control ion energy and etch anisotropy. In various embodiments, auxiliary RF generator 14 operates at the same frequency as master RF generator 12. A generator (not shown) may supply RF power to coupling network 24 via a 13 MHz-100 MHz signal and may be referred to as a source RF generator. The source RF generator provides energy to ignite a plasma in coupling network 24.

According to various embodiments, master RF generator 12 and auxiliary RF generator 14 include multiple ports to communicate externally. Master RF generator 12 includes a pulse synchronization output port 34, a digital communication port 36, and an RF output port 38. Auxiliary RF generator 14 includes an RF input port 42, a digital communication port 46, and a pulse synchronization input port 48. Pulse synchronization output port 34 outputs a pulse synchronization signal 50 to pulse synchronization input port 48 of auxiliary RF generator 14. Digital communication port 36 of master RF generator 12 and digital communication port 46 of auxiliary RF generator 14 communicate via a digital communication link 52. RF output port 38 generates a RF control signal 54 input to RF input port 42. In various embodiments, RF control signal 54 is substantially the same as the RF control signal controlling master RF generator 12. In various other embodiments, RF control signal 54 is the same as the RF control signal controlling master RF generator 12, but is phase shifted within master RF generator 12 in accordance with a requested phase shift generated by auxiliary RF generator 14. Thus, in various embodiments, master RF generator 12 and auxiliary RF generator 14 are driven by substantially identical RF control signals or by substantially identical RF control signal phase shifted by a predetermined amount.

Auxiliary RF generator 14 also includes a pair of sensor ports, main sense port 60 and auxiliary sense port 62, which receive a voltage signal from respective master voltage sensor 64 of master match network 20 and auxiliary voltage sensor 66 of auxiliary match network 28. In various embodiments, master voltage sensor 64 senses the voltage of master matched RF signal 22 to determine the voltage of master matched RF signal 22 applied to coupling network 24. Similarly, auxiliary voltage sensor 66 senses the voltage of auxiliary matched RF signal 30 applied to coupling network 24.

According to various embodiments, master voltage sensor 64 and auxiliary voltage sensor 66 detect operating parameters of the respective matched RF signals 22, 30. While described herein as voltage sensors, one skilled in the art will recognize that master voltage sensor 64 and auxiliary voltage sensor 66 may comprise voltage, current, and/or directional coupler sensors to detect selected electrical characteristics. In various embodiments, master voltage sensor 64 and auxiliary voltage sensor 66 may detect (i) voltage v and current i and/or (ii) forward (or source) power $P_{FWD}$ output from respective matched RF signals 22, 30 and/or reverse (or reflected) power $P_{REV}$ of master matched RF signal 22 and auxiliary matched RF signal 30. The voltage v, current i, forward power PFWD, and reverse power PREV may be scaled and/or filtered versions of the actual voltage, current, forward power, and reverse power associated with the respective matched RF signals 22, 30. In various embodiments, master voltage sensor 64 and auxiliary voltage sensor 66 may be analog and/or digital sensors. In a digital implementation, master voltage sensor 64 and auxiliary voltage sensor 66 may include analog-to-digital (A/D) converters and signal sampling components with corresponding sampling rates.

In various embodiments, voltage sensors 64, 66 are configured to determine an electrical characteristic of respective master RF signals 18, 26. In various other embodiments, voltage sensors 64, 66 are configured to detect an electrical characteristic of respective matched RF signals 22, 30. When voltage sensors 64, 66 are configured to detect the voltage of respective matched RF signals 22, 30, respective matched RF signals 22, 30 will reflect a phase shift typically introduced by respective match networks 20, 28. If voltage sensors 64, 66 are configured to detect an electrical characteristic of respective RF signals 18, 26, the sensor signals input to respective sense ports 60, 62 will not reflect the phase shift introduced by respective match networks 20, 28 to the respective matched RF signals 22, 30. In various embodiments, therefore, it may be necessary for the signals input to respective sense ports 60, 62 to be post processed to approximate the phase shift introduced by respective matched networks 22, 28.

One skilled in the art will recognize that master match network 20 and auxiliary match network 28 can be implemented as separate components or combined into a single component. Further, one skilled in the art will recognize that master voltage sensor 64 and auxiliary voltage sensor 66 can be implemented integrally with respective match networks 20, 28 or implemented separately from respective match networks 20, 28 and placed either upstream or downstream of respective match networks 20, 28.

In operation, master RF generator 12 generates master RF signal 18, and master match network 20 introduces a matching impedance into master RF signal 18 to generate master matched RF signal 22. Similarly, auxiliary RF generator 14 generates auxiliary RF signal 26, and auxiliary match network 28 introduces a matching impedance into auxiliary RF signal 26 to generate auxiliary matched RF signal 30. Operation of auxiliary RF generator 14 is coordinated with respect to master RF generator 12, thereby defining a master/slave relationship. Master RF generator 12 outputs an RF control signal 54 from RF output port 38. RF control signal 54 is input to RF input port 42 of auxiliary RF generator 14. RF control signal 54 can be a digital or analog signal and defines the RF operating frequency for auxiliary RF generator 14. When master RF generator 12 and auxiliary RF generator 14 are operating in a pulse mode of operation, as described above, master RF generator 12 generates pulse synchronization signal 50 from pulse synchronization output port 34. Pulse synchronization signal 50 is input to pulse synchronization input port 48 of auxiliary RF generator 14. Thus, the RF frequency and the pulsing of auxiliary RF generator 14 is controlled by inputs from master RF generator 12.

In various embodiments, auxiliary RF generator 14 communicates with master RF generator 12 via digital communication link 52 via respective digital communication ports 36, 46. Digital communication link 52 enables auxiliary RF generator 14 to communicate with master RF generator 12 to request adjustments to the RF control signal 54 to enable auxiliary RF generator 14 to align matched RF signals 22, 30 as measured by respective voltage sensors 64, 66.

In various embodiments, main sense port 60 and auxiliary sense port 62 communicate with respective voltage sensors 64, 66 to receive information about the respective matched RF signals 22, 30. Respective voltage sensors 64, 66 enable auxiliary RF generator 14 to determine the amplitude of respective matched RF signals 22, 30 and phase of the respective matched RF signals 22, 30. In various embodiments, the amplitude and phase of the RF signal may be controlled for each pulse state of the respective RF generators 12, 14. Amplitude and phase data is processed by auxiliary RF generator 14 in order to determine proper synchronization between master matched RF signal 22 and auxiliary matched RF signal 30. Once auxiliary RF generator 14 determines corrective adjustments to achieve proper synchronization, auxiliary RF generator 14 communicates with master RF generator via digital communication link 52 in order to communicate a desired phase adjustment.

Master RF generator 12 receives adjustment requests from auxiliary RF generator 14 and adjusts the phase of RF control signal 54 in accordance with the adjustment request. The phase of auxiliary matched RF signal 30 is, thus, phase locked to the phase of the master matched RF signal 22. In various embodiments, auxiliary RF generator 14 communicates other data to master RF generator. The other data may include pulsing information.

In various embodiments, master RF generator 12 determines the RF operating frequency of auxiliary RF generator 14. Master RF generator 12 can implement an agile frequency tuning (AFT) approach to minimizing reflected power. Master RF generator 12 can also set pulse conditions in accordance with desired pulse repetition rate, power levels, and duty cycles. In various embodiments, auxiliary RF generator 14 generates RF power at the frequency determined by master RF generator 12 and is phase locked to operation of master RF generator 12.

Figure 2:
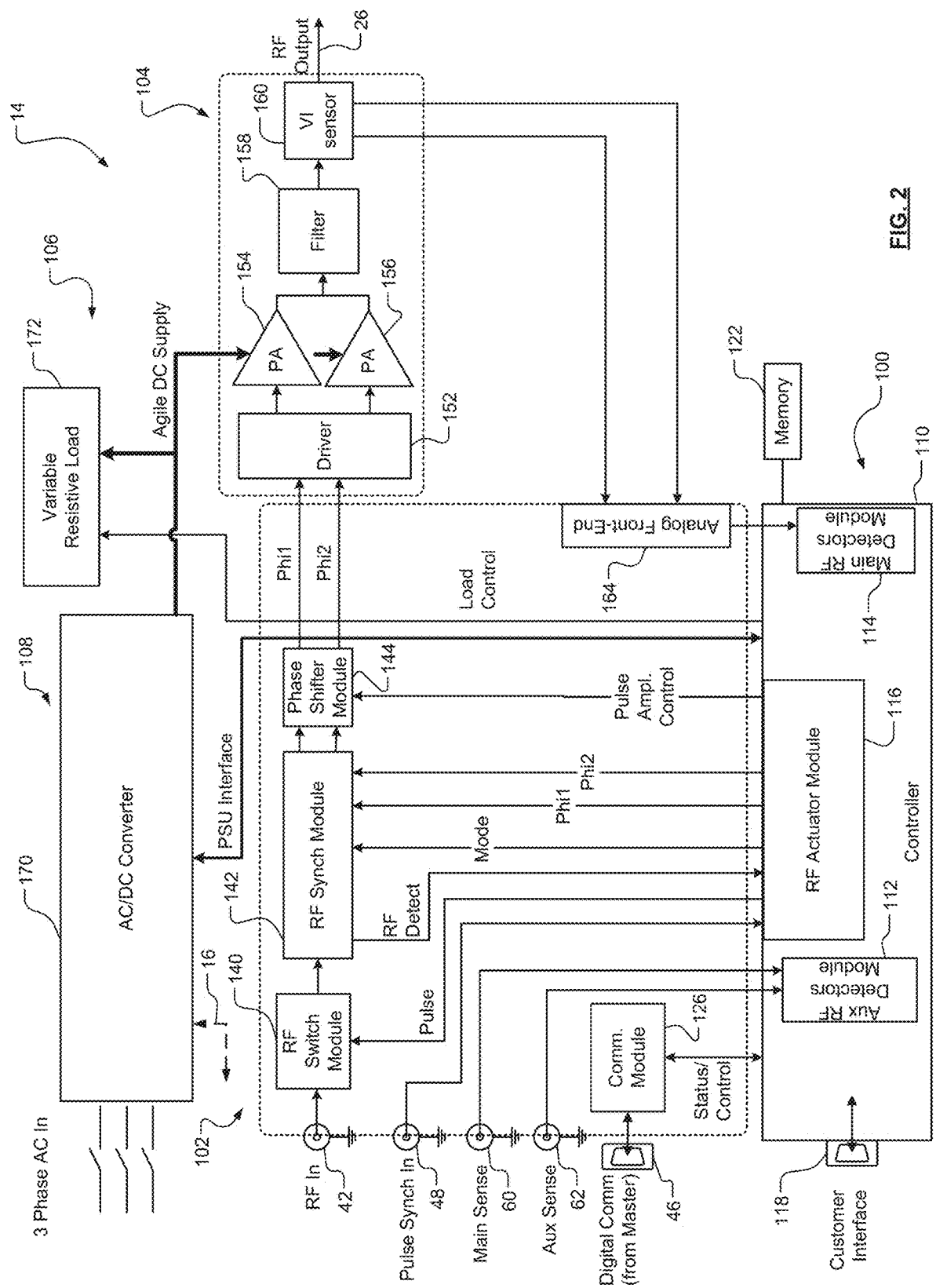
FIG. 2 is a schematic and functional block diagram of an auxiliary RF generator according to various embodiments.

FIG. 2 depicts a schematic and functional block diagram of an expanded view of auxiliary RF generator 14. Auxiliary RF generator 14 includes a controller section 100, a signal generation section 102, a power amplifier section 104, an energy dissipation section 106, and a DC generation section 108. Controller section 100 includes a control module or controller 110 which further includes an auxiliary RF detectors module 112, a main RF detectors module 114, an RF actuator module 116, and a customer interface 118. Auxiliary RF generator 14 may further include memory 122. Memory 122 may be used to store set, predetermined, and/or detected voltages, phases, and other operating parameters.

Auxiliary RF detectors module 112 communicates with main sense port 60 and auxiliary sense port 62. Auxiliary RF detectors module 112 receives main and auxiliary voltage sensor signals from respective master voltage sensor 64 and auxiliary voltage sensor 66 via respective main sense port 60 and auxiliary sense port 62. Auxiliary RF detectors module 112 of controller 110 determines the amplitude and phase (the relative phase or phase difference) of the respective master RF output and auxiliary RF output (either pre- or post-match network) and determines whether a phase or amplitude correction is necessary. The phase correction is communicated to master RF generator 12 via digital communication link 52. Auxiliary RF detectors module 112 communicates a desired phase correction via status/control line and communication module 126.

Controller 110 also includes main RF detectors module 114 which determines selected electrical characteristics of the RF output from power amplifier section 104. Main RF detectors module 114 communicates with controller 110 regarding the state of RF signal or output 26. Controller 110 also includes RF actuator module 116. RF actuator module 116 receives the pulse synchronization signal 50 via pulse synchronization input port 48. RF actuator module 116 also receives an RF detection signal from RF synchronization module 142, as will be described in greater detail herein. RF actuator module 116 generates control signals to control, in various modes, both the frequency and power of the continuous wave RF signal component of RF output 26 and the pulsing component of RF output 26.

Signal generation section 102 includes RF switch module 140 which receives RF control signal 54 from master RF generator 12 via RF input port 42. RF control signal 54 is communicated to RF switch module 140. RF switch module 140 also receives a pulse input from RF actuator module 116. The pulse input is generated by RF actuator module in accordance with pulse synchronization signal 50 received at pulse synchronization input port 48. RF switch module 140 controls generation of a pulsed sinusoidal signal, as will be described herein.

As will be described in greater detail herein, RF synchronization module 142 enables operation of auxiliary RF generator 14 as slave RF generator or as a stand-alone generator in which the RF sinusoidal component of the RF output signal is generated independently of master RF generator 12. In the slave configuration of auxiliary RF generator 14, in which master RF generator 12 controls operation of auxiliary RF generator 14, RF synchronization module 142 effectively passes through the pulsed RF signal received from RF switch module 140 and generates a pair of RF signals input to phase shifter module 144. Phase shifter module 144 receives pulse amplitude control signal from RF actuator module 116. Pulse amplitude control signal determines the relative phase shift between the pair of pulsed RF signals input to phase shifter module 144. Phase shifter module 144 generates a pair of phase shifted signals phi1 146 and phi2 148 which are output from signal generation section 102.

Phase shifted signals phi1 and phi2 are output to power amplifier section 104. The pair of phase shifted signals are input to driver 152. Driver 152 generates respective drive signals to power amplifiers 154, 156. The outputs from power amplifiers 154, 156 are combined and input to filter 158. In various embodiments, filter 158 may be a harmonic filter to remove harmonics and generate a filtered signal input to VI sensor 160. VI sensor 160 may be one of a voltage/current sensor or directional coupler as described above. Auxiliary RF generator 14 thus provides a pulsed, RF output 26.

Phi1 provides a drive signal for power amplifier 154, and phi2 provides a drive signal for power amplifier 156. In various embodiments, power amplifiers 154, 156 are driven by the drive signals to enable outphasing of power amplifiers 154, 156. Outphasing controls the amplitude of the output signal of power amplifier section 104 by varying the phase between power amplifiers 154, 156 by varying phi1 and phi2. One skilled in the art will recognize that various applications need not implement outphase signal generation and that various embodiments may use a single drive signal and power amplifier.

VI sensor 160 may be implemented as described above in connection with directional couplers and VI sensors. VI sensor 160 outputs a pair of sensor signals to analog front-end 164 of signal generation section 102. Analog front-end 164 receives analog signals from VI sensor 160 and generates digital signals input to main RF detectors module 114. VI sensor 160, analog front-end 164, and main RF detectors 114 enable measuring various electrical characteristics of the RF output from auxiliary RF generator 14.

In various embodiments, power amplifiers 154, 156 are configured to include voltage clamping circuits, such as inductive voltage clamping circuits. Examples of such system can be found with reference to U.S. Pat. Nos. 6,469,919; 6,618,276; 6,885,567; 7,180,758; and 7,397,676 assigned to the Assignee of the present application and incorporated by reference in this application.

Figure 3:
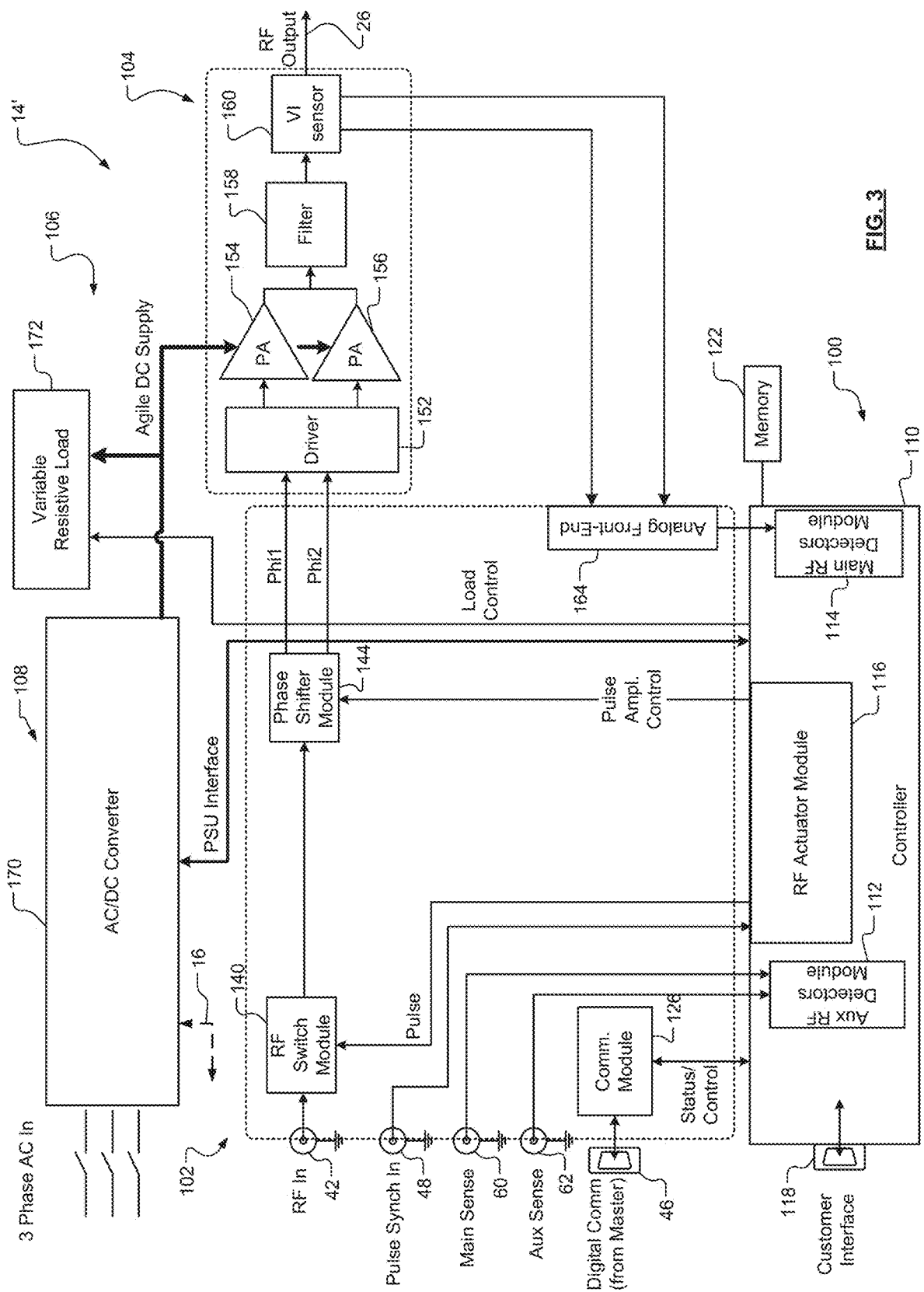
FIG. 3 is a schematic and functional block diagram of an auxiliary RF generator configured for operation in an auxiliary mode according to various embodiments.
Figure 4:
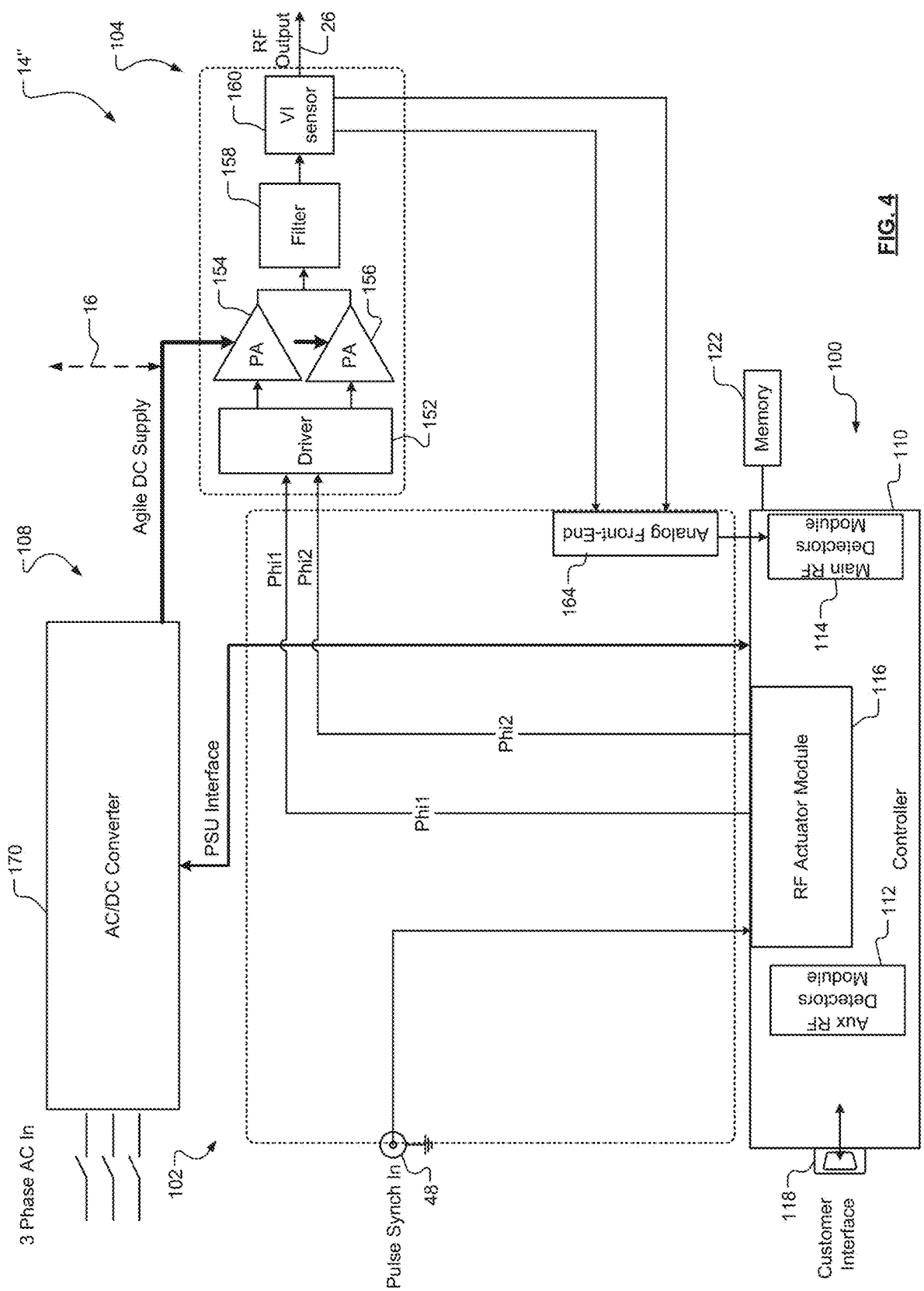
FIG. 4 is a block diagram of an auxiliary RF generator configured for operation in a stand-alone mode according to various embodiments.

Power amplifiers 154, 156 receive DC power generated from DC generation section 108. DC generation section 108 includes an AC/DC converter receiving a three phase AC input signal and generating a DC output signal. AC/DC converter 170 generates an agile DC supply voltage on voltage rails supplying respective power amplifiers 154, 156. AC/DC converter 170 generates a variable DC output voltage to thereby vary the amplitude of the RF signals output by respective power amplifiers 154, 156. Controller 110 of control section 100 communicates with AC/DC converter 170 via power supply unit (PSU) interface so that controller 110 can both monitor and vary operation of AC/DC converter 170 in order to generate desired rail voltages to power amplifiers 154, 156. DC bus 16 is shown connected to AC/DC converter 170. In FIGS. 2-4, DC bus 16 is shown in dotted lines to indicate that it can connect in various configurations to the respective main RF generator 12 and auxiliary RF generator 14.

DC generation section 108 communicates with energy dissipation section 106. Energy dissipation section 106 includes a variable resistive load 172 connected to the voltage rails connecting AC/DC converter 170 and power amplifiers 154, 156. Variable resistive load 172 provides a current drain or sink for power reflected from the load connected to RF output 26. In various embodiments, coupling network 24 reflects or transmits power back towards power amplifiers 154, 156. The voltage clamp circuits of power amplifiers 154, 156 return the reflected/transmitted power to variable resistive load 172 where the energy/power is dissipated. In various embodiments, reflected energy/power is dissipated in AC/DC converter 170, without the assistance of variable resistive load 172. However, in various other embodiments, AC/DC converter 170 is sized so that the power reflected from coupling network 24 is greater than the power dissipation capabilities of AC/DC converter 170. Variable resistive load 172 can be controlled via load control signal from controller 110 in order to vary the energy or reflected power dissipated via the inductive clamping circuits of power amplifiers 154, 156. Load control signal generated by controller 110 can use a pulse width modulation or a pulse density modulation signal to vary the impedance of variable resistive load 172, thereby variably controlling the power sourced from coupling network 24 towards power amplifiers 154, 156.

Referring to coupling network 24, as discussed above, in various embodiments, it is desirable to control the ion angle so that the ions are directed orthogonally at the workpiece or wafer in order to better control the etching process. As also described above, electrical power and fields near the edges of the wafers often present additional challenges accurately controlling ion directivity towards the wafer. By varying the resistance of the variable resistive load 172, ions near the edge of the wafer can be better directed to effect a more accurate etching process.

RF synchronization module 142 operates variably depending upon whether auxiliary RF generator 14 is operated in an auxiliary or master/stand-alone mode. Stand-alone mode occurs when auxiliary RF generator 14 operates independently of master RF generator 12. RF synchronization module 142 receives a mode signal from RF actuator module 116 of controller 110 that indicates whether auxiliary RF generator 14 is operating in an auxiliary mode or a master/stand-alone mode.

In an auxiliary or slave mode, signals phi1, phi2 output by RF actuator module 116 to RF synchronization module 142 have no effect. The RF signal received from RF switch module 140 is passed through RF synchronization module 142. Phase shifter module 144 generates drive control signals phi1 and phi2 in accordance with the pulse amplitude control signal received from RF actuator module 116.

In a master/stand-alone mode, auxiliary RF generator 14 relies upon RF actuator module 116 for controlling to a desired RF signal frequency. In various embodiments in a master/stand-alone mode, auxiliary RF generator 14 receives pulse synchronization signal 50 from pulse synchronization input port 48. In other various embodiments in a master/stand-alone mode, RF actuator module 116 determines a synchronization pulse. Also in a master/stand-alone mode, RF synchronization module 142 and phase shifter module 144 operate in a pass-through mode, as RF actuator module 116 generates drive signals phi1 and phi2 passed through to driver 152. In the stand-alone mode, power amplifiers 154, 156 are operated in an outphase manner, to vary the phase between power amplifiers 154, 156, in order to control the output power of auxiliary RF generator 14. In the auxiliary mode, variable resistive load 172 provides a dissipative load to variably dissipate power reflected from coupling network 24.

FIG. 3 depicts a structural and functional block diagram of the auxiliary RF generator 14' of the RF power system 10 configured to operate in an auxiliary or slave mode. Components from auxiliary RF generator 14 of FIG. 2 for enabling operation in a stand-alone mode have been removed to provide a simplified configuration of an RF generator in an auxiliary slave mode. In the configuration of FIG. 3, auxiliary RF generator 14' operates as described above with respect to FIGS. 1 and 2. Auxiliary RF generator 14' of FIG. 3 will not operate in a master or stand-alone mode.

FIG. 4 depicts a functional and structural block diagram of auxiliary RF generator 14" of RF power system 10 configured to operate in master or stand-alone mode. Components of auxiliary RF generator 14 of FIG. 2 for enabling operation in auxiliary mode have been removed. In this mode, auxiliary RF generator 14" does not require external RF signal input to determine the frequency of the RF signal it generates. In FIG. 4, pulse synchronization input port 48 receives pulse synchronization signal 50, which is input to RF actuator module 116 of controller 110. Pulse synchronization signal 50 controls the pulsing of the RF output of auxiliary RF generator 14". RF actuator module 116 does not generate pulse amplitude control signal to phase shifter module 144. Rather, RF actuator module 116 generates phi1 and phi2 signals input to driver 152. The auxiliary RF generator 14" of FIG. 4 does not include a variable resistive load 172, such as is shown in FIGS. 2 and 3. In various embodiments, the power amplifiers 154, 156 include inductive clamps, and power reflected from coupling network 24 to auxiliary RF generator 14 can be returned to AC/DC converter 170. In various other embodiments as shown in FIG. 4, AC/DC converter 170 will typically output a higher power and, therefore, variable resistive load 172 may be optional to dissipate likely power levels returned from coupling network 24. In various other embodiments, the inductive clamps of power amplifiers 154, 156 can return energy to the master RF generator 12 via a DC bus connection, such as DC bus 16 and such energy flow may be communicated through AC/DC converter or bypass AC/DC converter 170. If the energy flow bypasses AC/DC converter 170, DC bus 16 may be configured as shown in FIG. 4.

In the various embodiments described herein, the master and the slave can operate at the same frequency because drive signals originate at a common point in the system. Transient voltage spikes may occur in a phase lock loop (PLL) implementation during rapid frequency or amplitude changes. The direct path of the phase shifted master RF control signal 54 to the auxiliary power amplifiers 154, 156 of the present disclosure will prevent transient voltage spikes. Further, the integrated inductive clamp and variable resistive loads increase the range of voltage control at the electrode and the coupling network to which the auxiliary RF generator 14 provides power.

In various embodiments, auxiliary RF generator 14 can function as a master RF generator and master RF generator 12 can function as an auxiliary RF generator. That is, auxiliary RF generator 12 and the controller 110, in various embodiments, control the rail voltage to power amplifiers 154, 156 and the phase of RF output signal 26. In various other embodiments, controller 110 of auxiliary RF generator 14 also generates control signals input to master RF generator 12 to control the voltage and phase of master RF signal 18, including controlling a DC rail voltage in master RF generator to vary the voltage of master RF output signal 18 and controlling the phase of master RF signal 18 to control a phase difference between the RF signals output by respective auxiliary RF generator 14 and master RF generator 12. In various embodiments, auxiliary RF generator 14 outputs a RF signal to master RF generator 12 via RF input port 42, in which case RF input port 42 operates as an output port or an input/output port. Phase shifting between the RF output signals 18, 26 (or 22, 30) can occur when shifter module 144 effects a phase shift of RF output signal 26 relative the RF signal sent to master RF generator 12 via (reversed) input port 42. Alternatively, master RF generator 12 can include a phase shifter module similar to phase shifter module 144, and auxiliary RF generator 14 can output a commanded phase shift to master RF generator 12 via digital communication port 46 for application by a phase shifter local to main RF generator 12. Further, in various embodiments, main sense port 60 and auxiliary sense port 62 can be configured when master RF generator 12. In such a configuration, master RF generator 12 and auxiliary RF generator 14 can communicate sensed electrical characteristic information using digital communication ports 36, 46.

Figure 5:
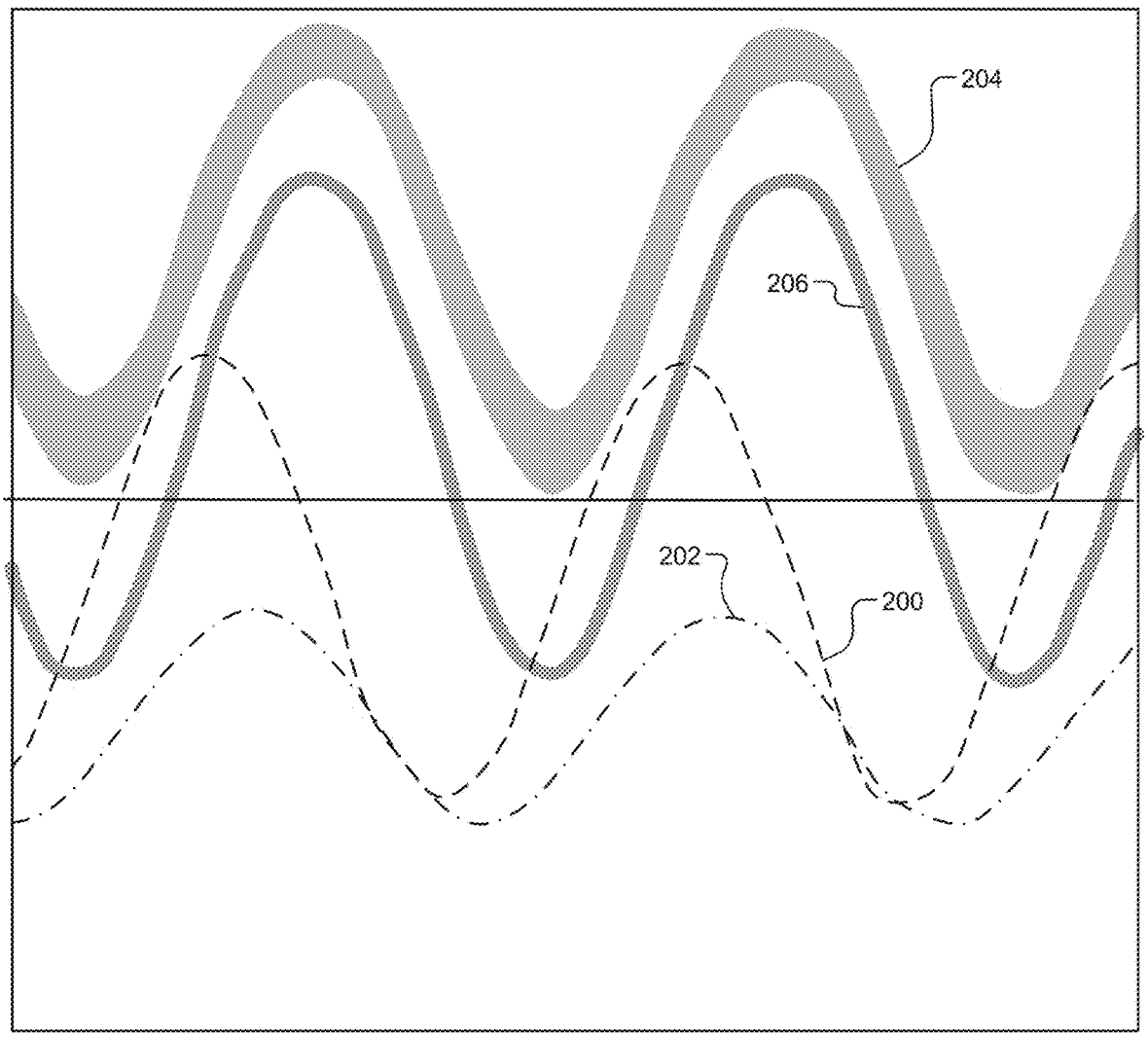
FIG. 5 is a plot illustrating waveforms in connection with operation of the RF power system of the present disclosure.

FIG. 5 depicts exemplary plots of RF signals of the RF power system 10 according to various embodiments. Waveform 200 depicts a RF signal output by master RF generator 12, such as master matched RF signal 22. Waveform 202 depicts a RF signal output by auxiliary RF generator 14, such as auxiliary RF signal 26. Waveforms 200 and 202 indicate a challenge that the present embodiments address. As can be seen when comparing waveforms 200 and 202, a phase difference exists between waveforms 200 and 202. Because match networks 20, 28 introduce different phase shifts, waveforms 200 and 202 are not phase-aligned. Waveforms 204 and 206 depict one improvement provided by the embodiments of the present disclosure.

Waveform 204 represents a matched RF signal 20 output from master match network 20. Waveform 204 has a thickness to indicate frequency content introduced into waveform 204 from other generators in RF power system 10, such as from a source RF generator. Waveform 206 depicts an example waveform of auxiliary matched RF signal 30 output from auxiliary match network 28. Waveform 206 is also depicted with a thickness to indicate high frequency content, such as from a source RF generator, although waveform 206 includes less frequency content than waveform 204. As can be seen, waveforms 204 and 206 depict phase aligned RF signals, as would be output by master RF generator 12 and auxiliary RF generator 14.

Figures 6, 7:
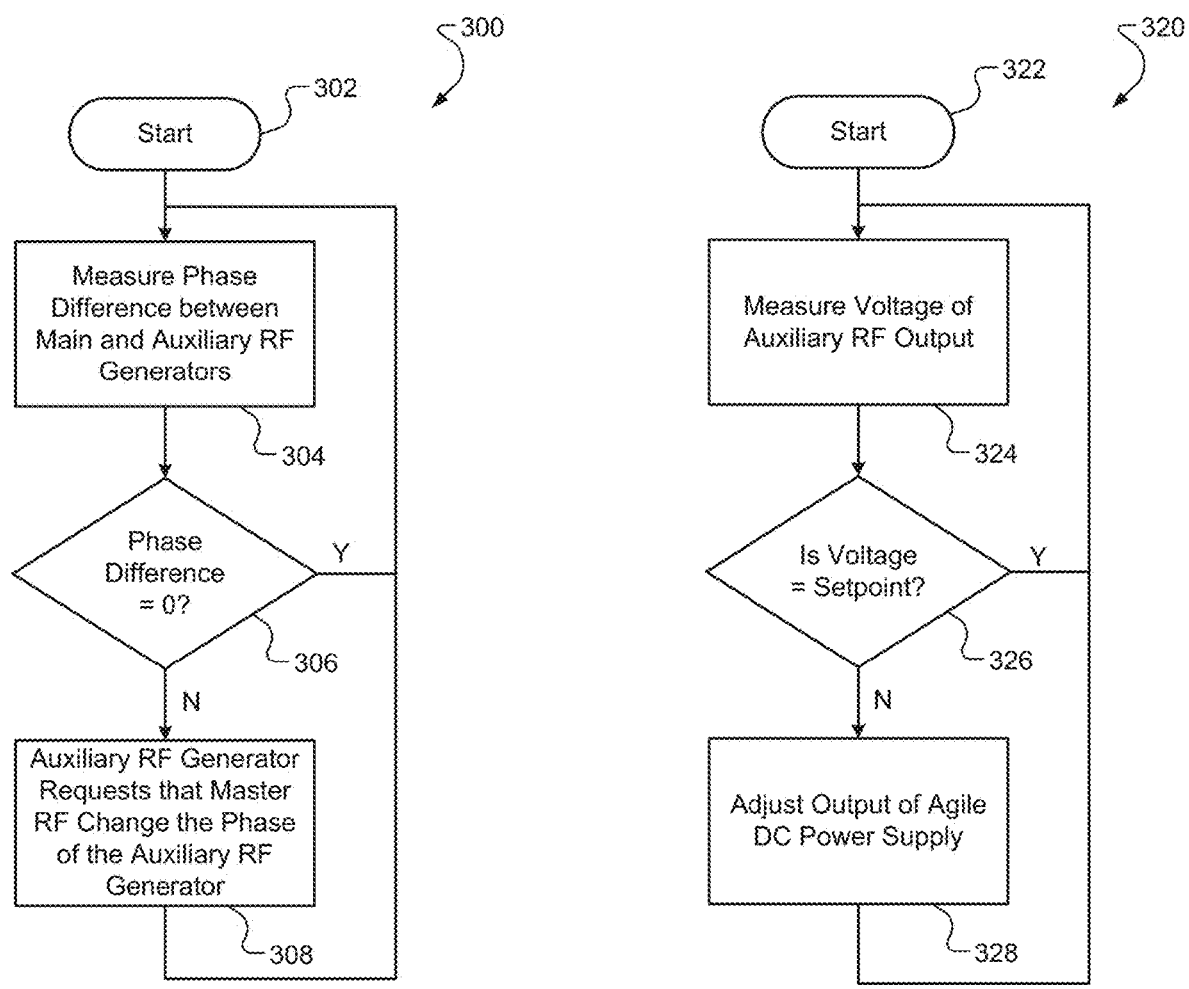
FIG. 6 is a flow chart depicting a phase control loop for the RF control system.
FIG. 7 is flow chart depicting a power control loop for the RF control system.

FIG. 6 depicts a flow chart 300 for adjusting the phase of the auxiliary RF generator, relative to the main RF generator. Control begins at block 302 and proceeds to block 304. Block 304 measures the phase difference between the main and auxiliary RF generators. Once the phase difference has been measured, control proceeds to block 306, where it is determined if the phase difference is zero. If the phase difference is zero, no adjustment is required, and control returns to block 304 to again measure the phase difference between the main RF generator and the auxiliary RF generator. If the phase difference is not zero, control proceeds to block 308 in which the auxiliary RF generator sends commands to the master RF generator to request that the master RF generator change the phase of the RF generator. Control proceeds to block 304 to again measure the phase difference between the main RF generator and the auxiliary RF generator.

FIG. 7 depicts a flow chart 320 for determining the voltage or power output of the auxiliary RF generator. Control begins at block 322 and proceeds to block 324. Block 324 measures the voltage of the RF output of the auxiliary RF generator. Once the voltage has been measured, control proceeds to block 326, where it is determined if the measured voltage is equal to a predetermined setpoint. If the measured voltage is equal to the predetermined setpoint, control proceeds to block 324 to again measure the voltage of the auxiliary generator RF output. If the measured voltage is not equal to the predetermined setpoint, control proceeds to block 328. At block 328, the output of the agile DC power supply is adjusted in order to vary the rail voltage applied to the power amplifiers of the auxiliary RF generator. Control proceeds to block 324 to again measure the voltage of the RF output of the auxiliary RF generator.

In various configurations, the RF control system of FIG. 1 is tunable within a predetermined operating space. For example, auxiliary match network 28 of FIG. 1 is typically controlled by selecting the position of a variable capacitance in auxiliary match network 28. In various configurations, a full range of positions of the variable capacitance is not always available, particularly over the entire operating space. The operating space in which a variable capacitance can be positioned to enable system operation is typically referred to as a tunable operating space. Preferably, the tunable operating space can be maximized. For example, auxiliary match network 28 may include a variable capacitance capable of adjustment to multiple positions. However, in various embodiments, only selected positions are available within predetermined frequency ranges. By way of non-limiting example, if the auxiliary RF generator 14 operates at up to 400 kHz, changing between positions at greater than a predetermined frequency, such as 380 kHz, results in extended settling times and oscillation between voltage and phase control loops for the RF signal applied auxiliary electrode 40. When outside of the tunable operating space, the control challenges include instability near an edge of the actuator range and oscillation or hunting for steady state values of auxiliary voltage and phase at higher frequencies.

FIGS. 8A-8E indicate the relationship between various electrical parameters for the RF power control system 10 of FIG. 1. FIG. 8A depicts voltage waveforms for the main voltage 400 and the auxiliary voltage 402 at the output of respective main match network 20 and auxiliary match network 28, respectively. The main voltage 400 and auxiliary voltage 402 may be measured in other places in the circuit of FIG. 1, according to various embodiments, including the respective main electrode 32 and auxiliary electrode 40. FIG. 8B depicts a waveform 404 indicating the net power in watts delivered by auxiliary RF generator 14. FIG. 8C depicts a waveform 406 indicating the phase difference in degrees between the RF signals applied to respective main electrode 32 and auxiliary electrode 40. FIG. 8D depicts a waveform 408 indicating the rail voltage $V_{RAIL}$ of the agile DC power supply voltage of FIG. 2 as set by a voltage actuator. FIG. 8E depicts a waveform 410 indicating the relative phase setpoint commanded by a phase actuator of auxiliary RF generator 14. The described phase, phase setpoint, or phase actuator is thus the desired phase determined by controller 110 of FIG. 2. In the case of a pulse RF envelope, the waveforms in FIG. 8 indicate the measured values for a given pulse state. For example, in the case of a pulse waveform with 4 states, there will be four measured values, one for each pulse state. Each pulse state results in a set of waveforms as in FIGS. 8A-8E indicating the respective values for each pulse state. In the case of continuous wave (CW) operation, there will be only one set of waveforms, similar to FIGS. 8A-8E. The controller 110 addresses each pulse state separately and smoothly transitions between state as they progress from 1 . . . n and then repeat.

As can be seen in FIGS. 8A-8E, starting at time $T_1$, an adjustment to the phase and rail voltage actuators of auxiliary RF generator 14, without consideration of the cross-term effects between the control loops, results in oscillation of waveforms 400, 402, 404, 406, 408, and 410. That is, the phase and rail voltage are adjusted independently. The phase is adjusted according to one control loop, and the rail voltage is adjusted according to a second control loop. The independent control leads to oscillation of the waveforms in FIGS. 8A-8E, the oscillation results in a corresponding instability, which inhibits the settling of waveforms 400-410.

FIGS. 9A-9E depict electrical characteristics similar to FIGS. 8A-8E and, therefore, the waveforms of 9A-9E will be referred to using like reference numerals from FIGS. 8A-8E. FIG. 9E indicates the response resulting from a transition in the variable capacitance of auxiliary match network 28. At time $T_1$, which represents a change in the process resulting in adjustment of one or both of the rail voltage $V_{RAIL}$ and the phase of auxiliary RF generator, the rail voltage 412 and the phase 410 initially diverge, as shown at respective points 412, 414, away from the settled or steady state values around time $T_2$ and beyond. In other words, upon the transition, the commanded rail voltage waveform 408 of FIG. 9D should increase from the rail voltage prior to time $T_1$ in order to reach a stable condition at $T_2$. However, as shown at point 412, rail voltage $V_{RAIL}$ decreases, rather than increases, before eventually converging to the value at time $T_2$. Likewise, the commanded phase at point 414 increases, rather than decreases, before converging to the settled value at time $T_3$. In other words, in response to the transition, both rail voltage and phase waveforms 408, 410, respectively, initially adjust away from their eventual settled value.

Figure 10A:
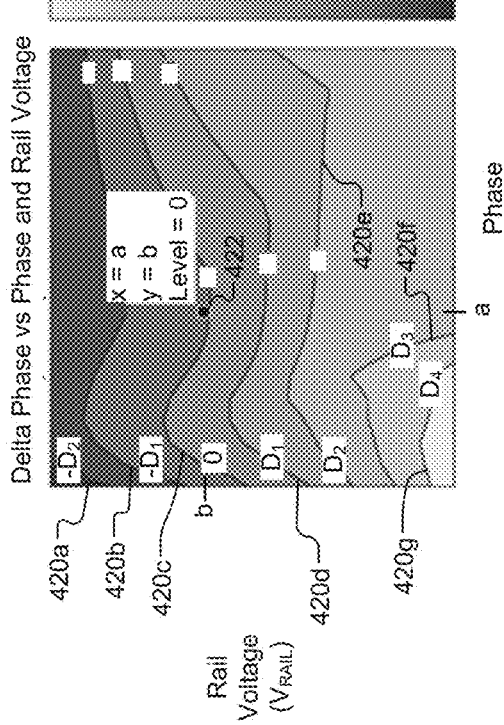
FIGS. 10A-10B are contour plots of selected electrical characteristics of a RF power system for an initial state.
Figure 10B:
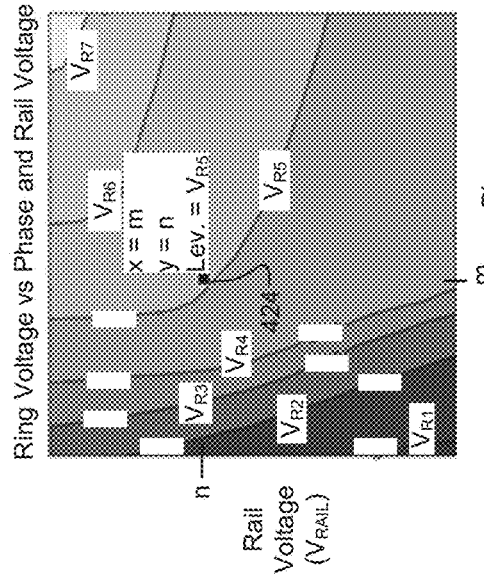

FIGS. 10A and 10B depict example contour plots of a RF system having a main and an auxiliary electrode. The contour plot of FIG. 10A will be described in detail. The description of the contour plot of FIG. 10A generally applies to the contour plots described throughout the specification. In FIG. 10A, the x-axis represents a phase or phase setpoint as defined by a phase actuator. The y-axis represents a rail voltage $V_{RAIL}$. The phase of the x-axis and the rail voltage $V_{RAIL}$ of the y-axis define two inputs for varying a delta phase defined along, in three dimensional space, a z-axis. In order to represent the z-axis in two dimensional space, contour lines 420a, 420b . . . , 420g define lines of constant delta phase. The delta phase is generally defined as the phase difference between the RF signal applied to main electrode 32 and the RF signal applied to auxiliary electrode 40. In various embodiments, contour line 420a corresponds to $-D_2$, indicating a negative delta phase or phase lag of the RF signal applied to auxiliary electrode 40 relative to the RF signal applied to main electrode 32. Contour line 420b corresponds to delta phase $-D_1$, contour line 420c corresponds to a 0 delta phase, contour line 420d corresponds to delta phase $D_1$, contour line 420e corresponds to delta phase $D_2$, contour line 420n corresponds to delta phase $D_3$, and contour line 420g corresponds to delta phase $D_4$. The regions between the contour lines represent a transition in delta phase, which may be gradual or severe, between the respective contour lines.

FIG. 10A indicates the delta phase that corresponds to a particular combination of phase of the RF signal applied to auxiliary electrode 40 and the rail voltage $V_{RAIL}$ for auxiliary RF generator 14. As described above, rail voltage $V_{RAIL}$ represents the output of agile DC power supply and applied to respective power amplifiers 154, 156. By way of non-limiting example, point 422 of FIG. 10A indicates that for a given phase (x-axis) and rail voltage $V_{RAIL}$ (y-axis), the delta phase=0. That is, for phase x=a and rail voltage $V_{RAIL}$ y=b, the delta phase Level=0 (z=0).

FIG. 10B is a contour plot indicating the auxiliary voltage relative to the phase (x-axis) of auxiliary RF generator 14 and the rail voltage $V_{RAIL}$ (y-axis) output by agile DC power supply of FIG. 2. The auxiliary voltage is generally described as the voltage at auxiliary electrode 40 and may be measured using peak-to-peak or Root Mean Square (RMS) techniques. The contour lines of FIG. 10B indicate the auxiliary voltage at auxiliary electrode 40. Of particular interest, by way non-limiting example, is point 424 of FIG. 10B. For a given phase x=n and rail voltage $V_{RAIL}$ y=n, the auxiliary voltage Level=$V_{R5}$, as shown at point 424.

Figure 11A:
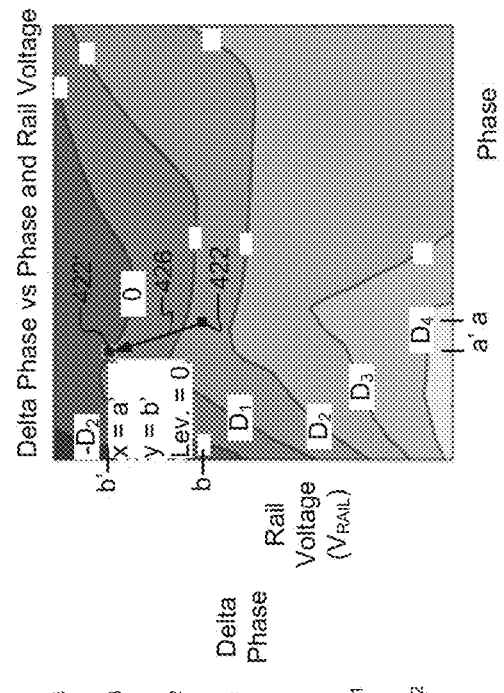
FIGS. 11A-11B are contour plots of selected electrical characteristics following transition of an RF power system from an initial state in FIGS. 10A-10B to a final state.
Figure 11B:
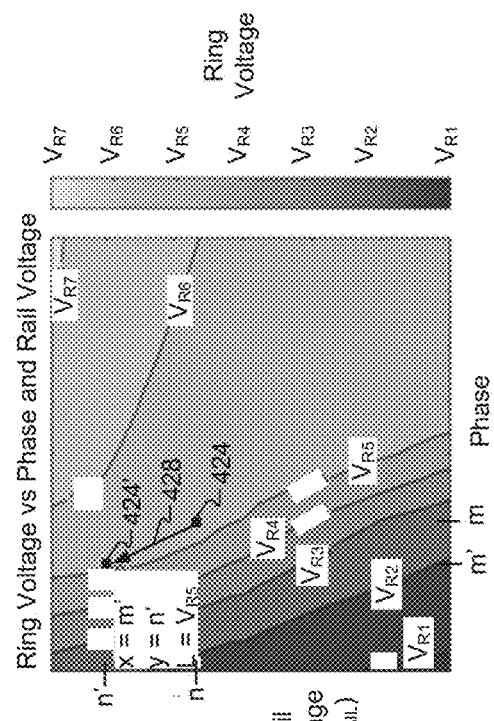

FIGS. 11A and 11B are contour plots depicting a transition from an initial condition represented by FIGS. 10A and 10B to a second condition represented by FIGS. 11A and 11B. For example, in various embodiments, FIGS. 10A and 10B can represent the delta phase versus the phase and rail voltage $V_{RAIL}$ (for FIG. 10A) and the auxiliary voltage versus the phase and rail voltage $V_{RAIL}$ (FIG. 10B) for a RF power delivery system in which auxiliary match network 28 is configured so that a tunable element of auxiliary match network 28 is in a first position. FIGS. 11A and 11B represent the corresponding delta phase versus phase and rail voltage $V_{RAIL}$ (FIG. 11A) and auxiliary voltage versus phase and rail voltage $V_{RAIL}$ (FIG. 11B) when the tunable element of auxiliary match network 28 is displaced to a second position. In various embodiments, the tunable element can be adjusted from a first position to a second position.

With reference to FIGS. 10A and 11A, selected point 422 represents phase a=rail voltage $V_{RAIL}$=b, and the resulting delta phase Level=0. As shown in FIG. 10A, point 422 is located on contour line delta phase=0. Following the transition, the position of the contour lines change, where contour values $-D_2, -D_1, \ldots, D_4$ represent the same values in FIGS. 10A and 11A. In various embodiments, it is preferred that point 422 remain on the same counter line, such as delta phase=0, in this non-limiting example. In order to remain on the same contour line, point 422 must transition from point 422 in FIG. 10A to point 422' in FIG. 11A. This transition occurs along arrow 426. In order to move from point 422 to point 422', it is necessary to adjust both the phase from x=a to x=a' and the rail voltage $V_{RAIL}$ from y=b to y=b' in order to maintain the position of point 422 on contour line delta phase=0.

Likewise, in FIG. 10B, point 424 is shown for phase x=m, rail voltage $V_{RAIL}$=n, and auxiliary voltage Level=$V_{R5}$. The contour lines for $V_{R1}, \ldots, V_{R7}$ in FIGS. 10B and 11B represent similar values. Point 424 in FIG. 10B is shown along contour line $V_{R5}$. In order to maintain point 424 on contour line $V_{R5}$, point 424 of FIG. 10B transitions to point 424' along arrow 428 of FIG. 11B. As FIG. 11B demonstrates, it is necessary to vary both the phase to x=m' and the rail voltage $V_{RAIL}$ to y=n' in order to maintain point 424 along contour line $V_{R5}$, such as shown at point 424'. Thus, in each instance of translation of point 422 to point 422' as shown in FIGS. 10A and 11A and point 424 to point 424' as shown in FIGS. 10B and 11B, it is necessary to reduce the phase setpoint and increase the rail voltage $V_{RAIL}$. Thus, FIGS. 10A and 10B and FIGS. 11A and 11B demonstrate, in various embodiments, that it is necessary to control both phase and rail voltage $V_{RAIL}$ in order to maintain the position along a predetermined contour line.

Figure 12A:
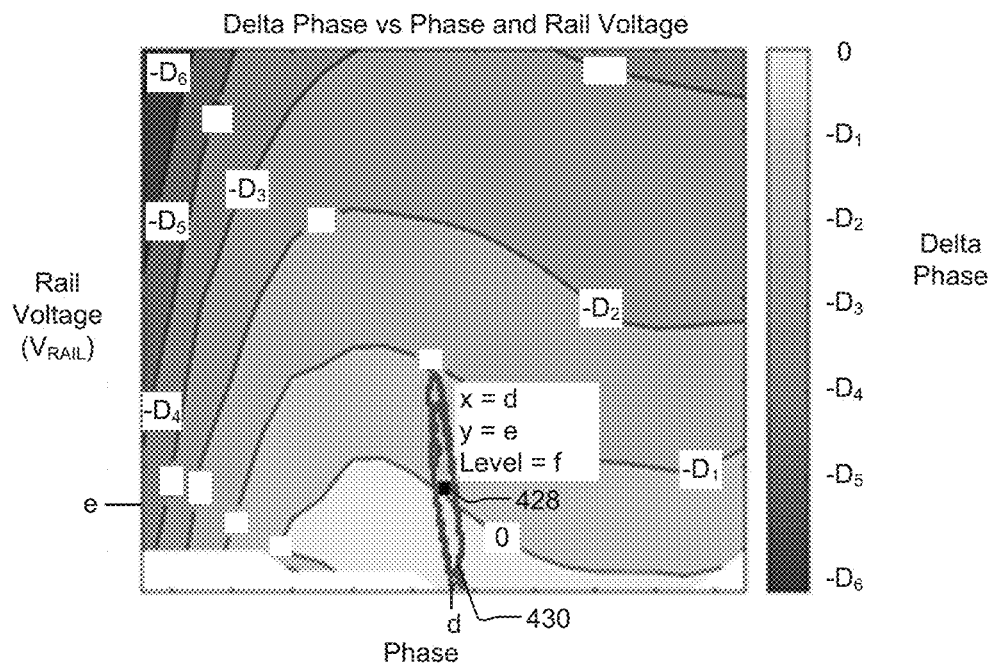
FIGS. 12A-12B are contour plots of selected electrical characteristics of a RF power system in which multiple inputs effect control of selected outputs, according to various embodiments.
Figure 12B:
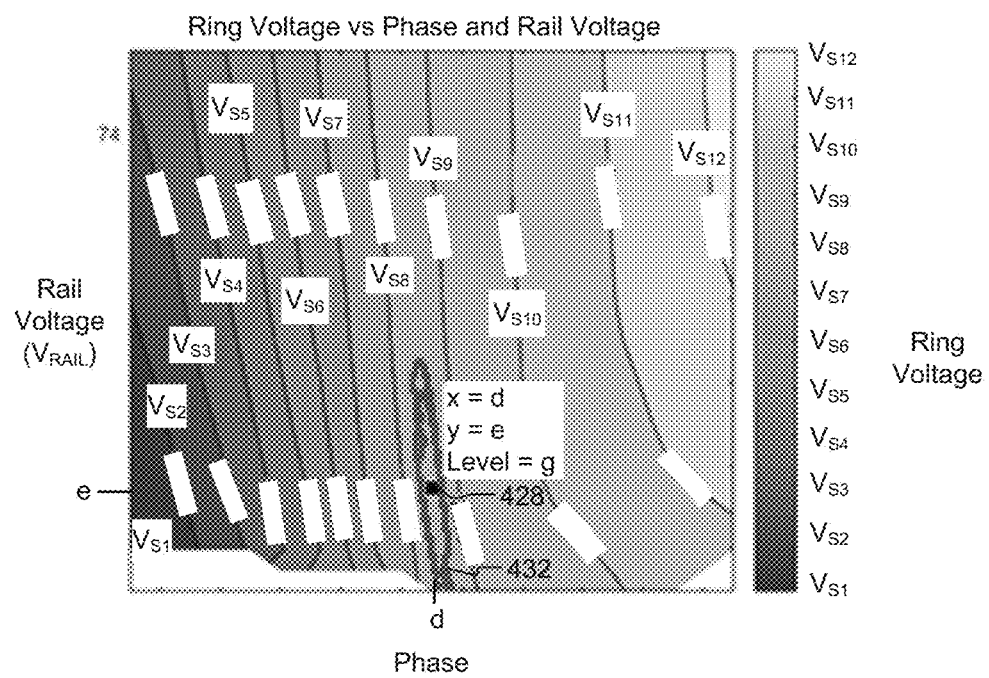

FIGS. 12A and 12B depict contour plots of delta phase versus phase and rail voltage $V_{RAIL}$ in FIG. 12A and auxiliary voltage versus phase and rail voltage $V_{RAIL}$ in FIG. 12B. Each contour plot in FIGS. 12A and 12B depicts a point 428 corresponding to a phase=d, a rail voltage $V_{RAIL}$=e, and a delta phase=f in FIG. 12A and an auxiliary voltage=g in FIG. 12B. Plots 430 and 432 and respective contour plots of FIGS. 12A and 12B indicate a challenge to approaching a rail voltage $V_{RAIL}$ and phase solution in each of FIGS. 12A and 12B.

As shown in FIG. 12A, in the area around point 428, changing the rail voltage $V_{RAIL}$ significantly affects the delta phase, since point 428 is in a position where the contour lines are generally parallel to the rail voltages $V_{RAIL}$. The change in delta phase correspondingly affects convergence to point 428 in FIG. 12B. Further, as shown in FIG. 12B, the auxiliary voltage contours $V_1, \ldots, V_{12}$ are parallel to the phase values so that small phase actuator changes significantly affect the voltage. Similarly, in FIG. 12B, the auxiliary voltage contour lines $V_1, \ldots, V_{12}$ are generally perpendicular to the rail voltage $V_{RAIL}$ values. Therefore, large rail voltage $V_{RAIL}$ changes are needed to make small changes in the auxiliary voltage. Accordingly, waveforms 430 and 432 indicate a circling around the desired endpoint 428 by changing the phase and the rail voltage $V_{RAIL}$ using independent control loops in order to arrive at a desired setpoint on a selected contour.

FIGS. 12A and 12B demonstrate a particular challenge to various configurations of the RF power supply system 10 of FIG. 1 in which adjusting a single input presents challenges to accurate control of the auxiliary voltage. It can be seen that significant increases in one of the phase or rail voltage $V_{RAIL}$ are necessary in order to change the position of a point, such as point 428, along a contour line and minor changes in the other variable result in significant changes in the position of point 428 along a contour line. Thus, a single input system can result in certain challenges in which a single input is varied in order to adjust a particular output.

Figure 13:
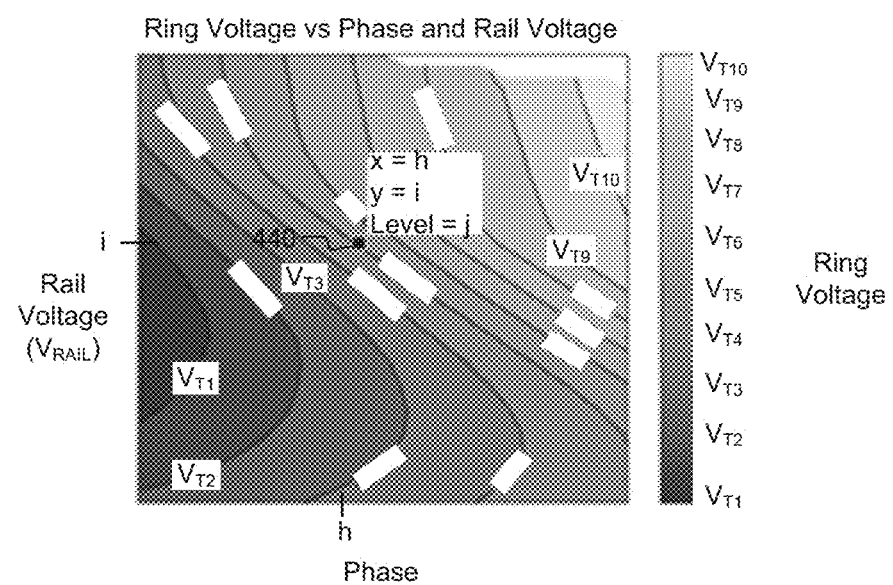
FIG. 13 is a contour plot depicting rail voltage contours of an output voltage under selected conditions.

By way of comparison, FIG. 13 indicates a contour plot in which the rail voltage $V_{RAIL}$ can be varied in order to adjust the position of a point, such as point 440. In FIG. 13, point 440 corresponds to a phase of x=h, rail voltage $V_{RAIL}$ y=i, and a resulting auxiliary voltage=j. FIG. 13 presents a condition in which varying one of the inputs, whether the phase along the x-axis or the rail voltage $V_{RAIL}$ along the y-axis enables adjustment of point 440 along a contour line, such as along contour line $V_{T5}$ with reasonable resolution. In contrast, FIGS. 12A and 12B do not enable such resolution by adjusting one of the phase along the x-axis or $V_{RAIL}$ along the y-axis.

Figure 14:
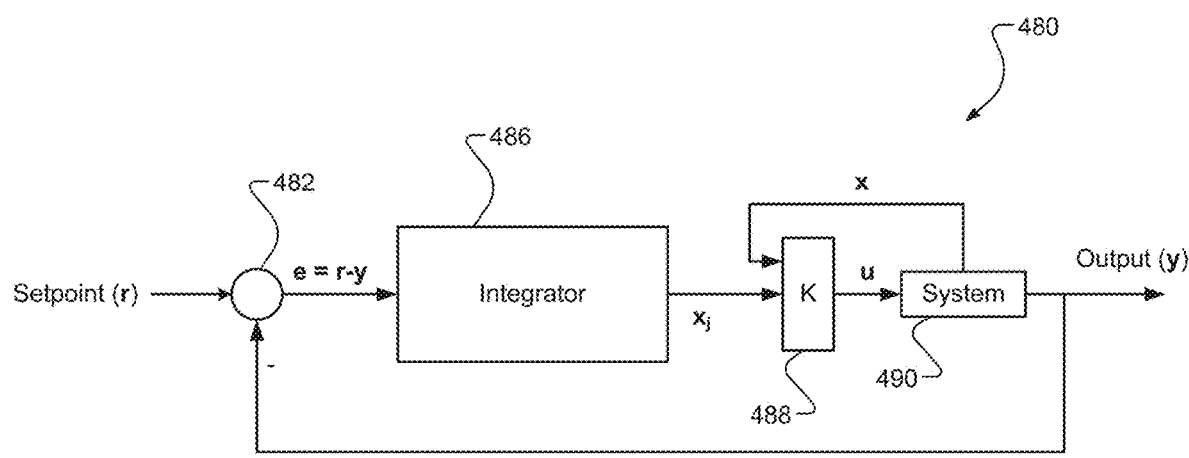
FIG. 14 is a functional block diagram of a control system for a RF power system according to various embodiments.

FIG. 14 depicts a linear-quadratic-integral (LQI) control system for, in various embodiments, controlling the agile DC power supply actuator (rail voltage $V_{RAIL}$) and phase actuator (phase) of auxiliary RF generator 14 of FIGS. 1-4. The LQI configuration of FIG. 14 provides optimal control in which controller gains are determined based on minimization of a cost function. Such a configuration utilizes both internal measurements and output feedback for controlling selected parameters of auxiliary RF generator 14. The control system of FIG. 14 is inherently multi-input, multi-output (MIMO). In various embodiments, performance is highly tunable, including enabling individual adjustment for feedback errors, states, and actuator amplitudes.

In FIG. 14, control system 480 receives an input value r, which represents a vector or a matrix, which is the auxiliary voltage setpoint and setpoint for the delta phase or phase difference between the main and auxiliary RF signals:

$$r = \begin{bmatrix} r_{Aux} \\ r_{Delta\ Phase} \end{bmatrix} \quad (1)$$

where:

$r_{Aux}$ represents the setpoint for the voltage of the RF waveform applied to the auxiliary electrode; and $r_{Delta\ Phase}$ represents the setpoint for the phase difference or delta phase between the master and auxiliary RF waveforms.

The setpoint r is compared to system output:

$$y = \begin{bmatrix} y_1 \\ y_2 \end{bmatrix} = \begin{bmatrix} V_{Aux} \\ \Delta_{Phase} \end{bmatrix} \quad (2)$$

where:

$y_1 = V_{Aux}$ represents the measured voltage of the RF waveform applied to the auxiliary electrode; and $y_2 = \Delta_{Phase}$ represents the measured phase difference between main RF waveform and the auxiliary RF waveform.

The input r is applied to a summer 482 which determines a difference or error, represented as a matrix or vector e. The matrix or vector e represents the difference between the auxiliary voltage setpoint $r_{Aux}$ and the measured auxiliary voltage output $y_{Aux}$ and the difference between the delta phase setpoint $r_{Delta\ Phase}$ and the measured delta phase output $\Delta_{Phase}$. That is:

$$e = \begin{bmatrix} e_{Aux} \\ e_{Delta\ Phase} \end{bmatrix} = \qquad (3)$$

$$r - y = \begin{bmatrix} r_{Aux} \\ r_{Delta\ Phase} \end{bmatrix} - \begin{bmatrix} V_{Aux} \\ \Delta_{Phase} \end{bmatrix} = \begin{bmatrix} r_{Aux} - V_{Aux} \\ r_{Delta\ Phase} - \Delta_{Phase} \end{bmatrix}$$

where:

$e_{Aux}$ represents the error or difference between the commanded RF voltage applied to the load and the actual RF voltage applied to the load; and $e_{Delta\ Phase}$ represents the error or difference between the commanded and actual phase difference between the main signal and the auxiliary RF signal.

The error e is input to an integrator 484 and the integrated error values, represented by a matrix or vector $x_j$, is applied to block 488. The matrix or vector $x_j$, can be represented as follows:

$$x_j = \begin{bmatrix} x_3 \\ x_4 \end{bmatrix} \qquad (4)$$

where:

$x_3$ represents the integral of the auxiliary electrode error output by integrator 486; and $x_4$ represents the integral of the phase difference error output by integrator 486.

Block 488 receives the integrated error values e and also receives a matrix or vector of values x which includes the internal states output by system block 490. The matrix or vector x is represented as follows:

$$x = \begin{bmatrix} x_1 \\ x_2 \end{bmatrix} = \begin{bmatrix} x_{Rail} \\ x_{Phase} \end{bmatrix} \qquad (5)$$

where:

$x_1 = x_{Rail}$ represents the measured auxiliary rail voltage state output by system 490, as will described further below; and $x_2 = x_{Phase}$ represents the measured auxiliary phase state output by system 490. Block 488 is a gain block which applies a feedback gain matrix K to generate a control matrix or vector u to system block 490. The matrix or vector u is represented as follows:

$$u = \begin{bmatrix} u_1 \\ u_1 \end{bmatrix} \qquad (6)$$

where:

$u_1$ represents the commanded rail voltage $V_{Rail}$ for the auxiliary RF generator; and $u_2$ represents the commanded phase of the RF waveform output by the auxiliary RF generator.

System block 490 is responsive to input u to adjust the auxiliary voltage output $y_{aux}$ and the phase output $y_{phase}$.

The LQI or state representation depicted in FIG. 14 replaces an $n^{th}$ order differential equation with a single first order matrix differential equation. In the control system 480 of FIG. 14, u described above in equation (6) can be further described as shown below:

$$u = \begin{bmatrix} u_1 \\ u_2 \end{bmatrix} = \begin{bmatrix} K_{11} & K_{12} & K_{13} & K_{14} \\ K_{21} & K_{22} & K_{23} & K_{24} \end{bmatrix} \begin{bmatrix} x_1 \\ x_2 \\ x_3 \\ x_4 \end{bmatrix} \qquad (7)$$

where:

$K_{11}$, $K_{12}$, $K_{21}$, and $K_{22}$ represent the state feedback;

$K_{13}$ and $K_{14}$ represent correction constants for the auxiliary voltage;

$K_{23}$ and $K_{24}$ represent correction constants for the phase actuator; and $x_2$, $x_3$, and $x_4$ are as described above.

In various embodiments, $K_{11}$, $K_{12}$, $K_{21}$, and $K_{22}$, are configured with the recognition that because the auxiliary voltage and phase voltage react quickly, only minimal secondary effects exist. Accordingly, $K_{11}$, $K_{12}$, $K_{21}$, and $K_{22}$ are used to approximate slewing dynamics of the auxiliary voltage and phase. In various embodiments, the K constants are set in accordance with predetermined contours used to characterize the auxiliary RF generator at the time of manufacture. The slope between the contours is used to determine the K values. In various embodiments, the K constants are set based on in-situ measurements of the contours for the auxiliary RF generator for a given operating condition.

FIG. 15A depicts a plot of the auxiliary voltage relative to the phase on the x-axis and the rail voltage $V_{RAIL}$ on the y-axis. While in various representations, auxiliary voltage can be represented by shading or color, or FIGS. 15A and 15B include multiple quadrants, including quadrants 500, 502 . . . , 510. Similarly, FIG. 15B depicts a plot of phase offset versus phase on the x-axis and rail voltage $V_{RAIL}$ on the y-axis. The various quadrants 512, 514, . . . , 522 indicate the phase offset between the master RF generator 12 and auxiliary RF generator 14.

FIGS. 16A and 16B correspond to respective FIGS. 15A and 15B, with FIGS. 16A and 16B indicating the respective auxiliary voltage and phase offset in response to when the contour lines are arranged such that the RF power system may oscillate when converging to a solution, such as in FIGS. 12A and 12B. Accordingly, quadrants 500', 502', . . . , 510' in FIG. 16A indicate the location of the quadrants 500, . . . , 510 of FIG. 15A under such convergence-challenged conditions. As can be seen in FIG. 16A, the shape of the auxiliary voltage from FIG. 15A has been reflected about an approximately 45 degree angle line. Similarly, the plot of FIG. 15B has been displaced such that the position of the contours have been similarly reflected around an approximately 45 degree angle line. The positions of respective points 512', 514', . . . , 518' indicate the reflection of the corresponding quadrants of FIG. 15B.

Figure 17A:
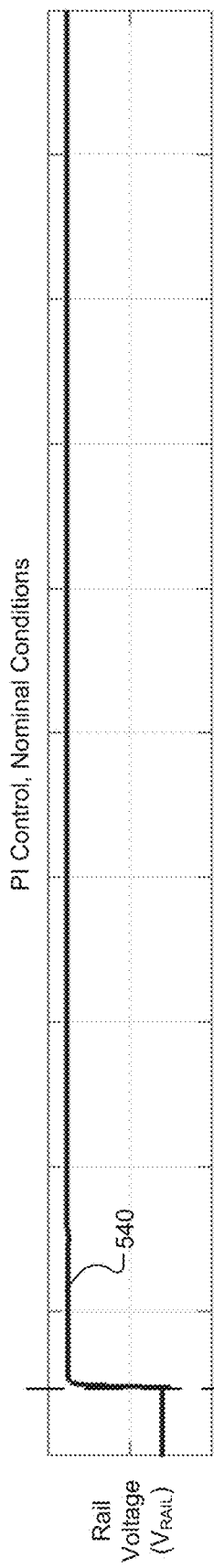
FIGS. 17A-17D are plots of selected electrical characteristics of a RF power system controlling a single input for a selected output operating under nominal conditions.
Figure 17B:
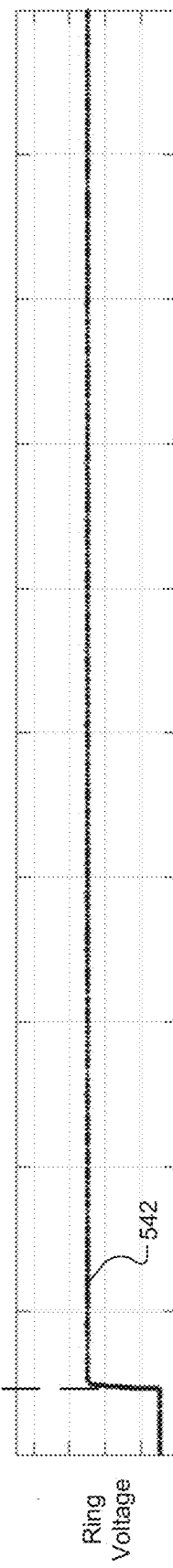
Figure 17C:
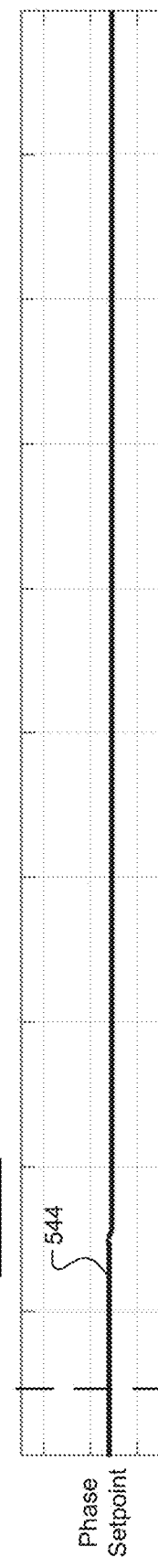
Figure 17D:
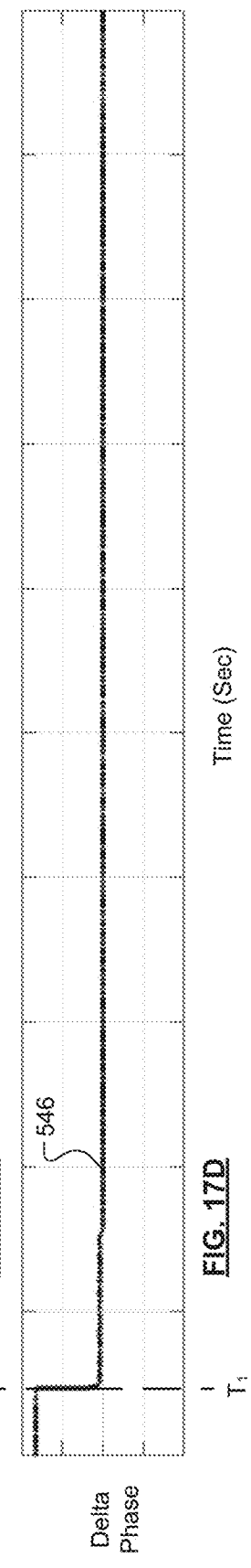
Figure 19A:
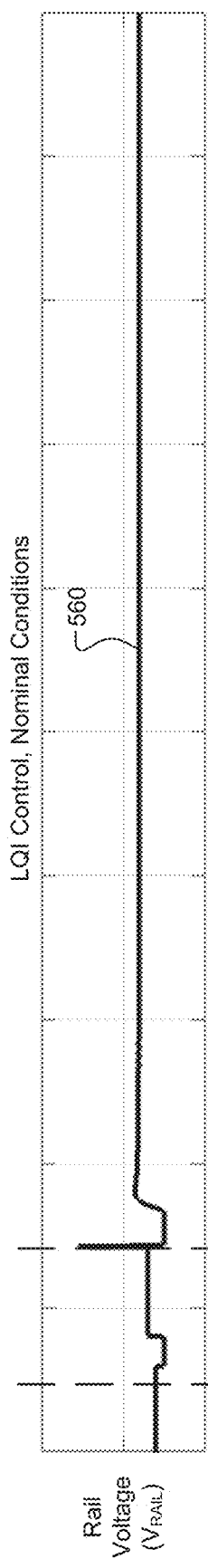
FIGS. 19A-19D are plots of selected electrical characteristics of a RF power system under nominal conditions controlled using the control system of FIG. 14.
Figure 19B:
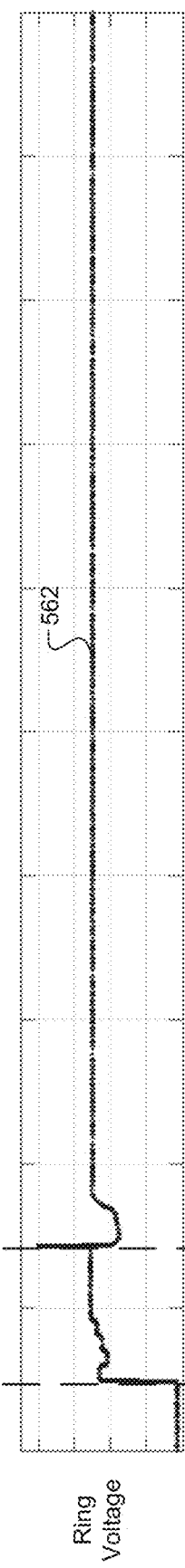
Figure 19C:
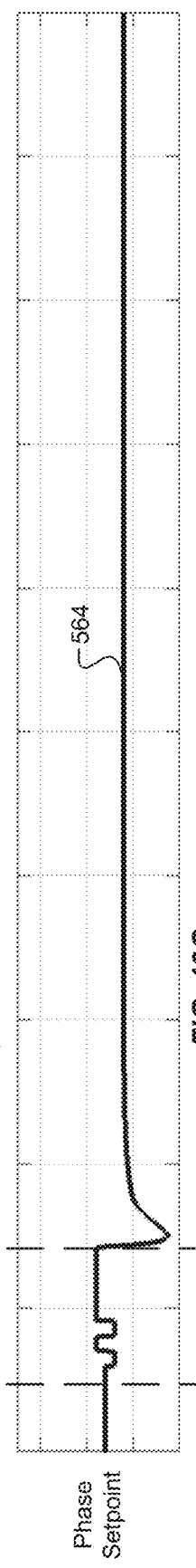
Figure 19D:
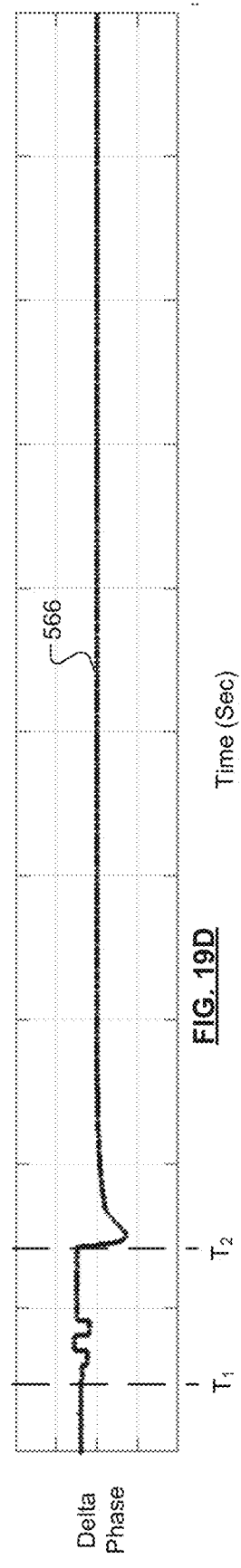

FIGS. 17A-17D depict plots of various respective electrical parameters relative to time using proportional-integral control according to various embodiments under conditions in which contour lines are arranged in a configuration to facilitate convergence to a predetermined auxiliary voltage and delta phase solution. Accordingly, FIG. 17A indicates a waveform 540 of a rail voltage setpoint. FIG. 17B indicates a waveform 542 of the auxiliary voltage. FIG. 17C indicates a waveform 544 of a phase setpoint. FIG. 17D indicates a waveform 546 of a delta phase between a master RF generator 12 and an auxiliary RF generator 14. As can be seen at time $T_1$, when the RF generator moves into closed-loop operation after power-up, the auxiliary voltage correspondingly increases and the delta phase decreases. Both the auxiliary voltage 542 and the delta phase 546 reach stability almost instantaneously.

FIGS. 18A-18D depict waveforms corresponding to the electrical characteristics of respective FIGS. 17A-17D. In FIGS. 18A-18D, the auxiliary voltage contour lines and/or the delta phase contour lines are arranged such that convergence to a predetermined solution results in seeking or hunting about a desired solution endpoint. Waveform 540' corresponds to a rail voltage $V_{RAIL}$, waveform 542' corresponds to auxiliary voltage, waveform 544' corresponds to phase setpoint, and waveform 546' corresponds to delta phase. At time $T_1$, the RF generator output is powered up in open-loop mode to a pre-defined starting point for both the rail voltage and phase actuators. At time $T_2$, the RF generator enters closed-loop operation. Rail voltage 540' and auxiliary voltage 542' are seen to exhibit an instability at $T_2$, and, to a lesser degree, phase setpoint 544' and delta phase 546' also exhibit an instability. At $T_3$ the RF generator output is disabled prior to shutting down. As can be seen in FIGS. 18A-18D, under selected conditions the rail voltage and phase actuators system tends to oscillate.

FIGS. 19 and 20 depict waveforms for FIGS. 19A-19D and FIGS. 20A-20D depicting the similar electrical characteristics to waveforms for respective FIGS. 17A-17D and/or FIGS. 18A-18D. FIGS. 19A-19D and FIGS. 20A-20D, however, indicate system response using control described with respect to FIG. 14. Waveform 560 depicts the rail voltage $V_{RAIL}$ for auxiliary RF generator 14, waveform 562 depicts the auxiliary voltage applied to auxiliary electrode 40 of coupling network 24, waveform 564 depicts the phase setpoint for auxiliary RF generator 14, and waveform 566 depicts the delta phase between the RF signals applied to respective master electrode 32 and auxiliary electrode 40. Waveforms 560', 562', 564', and 566' depict waveforms for similar electrical characteristics.

FIGS. 19A-19D depict waveforms in which the contour plots for a RF system are arranged to facilitate convergence to a predetermined point. The waveforms of FIGS. 19A-19D represent an embodiment in which control is provided using the control model of FIG. 14. FIGS. 20A-20D, on the other hand, depict control implemented by the control support system of FIG. 14 for a configuration where the delta phase and the auxiliary voltage contour lines are arranged so that the rail voltage $V_{RAIL}$ and/or phase setpoint may hunt for a solution. As shown in FIGS. 19A-19D and FIGS. 20A-20D, utilizing the control provided in FIG. 14 indicates that waveforms 560', 562', 564', 566' converge to stability relatively quickly with respect to the waveforms of nominal conditions 560, 562, 564, 566. As can be seen in FIGS. 19A-19D and 20A-20D, at $T_1$, the controller enters a learning phase. The actuators are steered through a pre-defined sequence and the auxiliary voltage and delta phase outputs are recorded. Using the information, the contour slopes for the current operating condition are calculated. These are then used to update the K matrix of controller gains. At time $T_2$, the RF generator enters a closed-loop mode of operation with these updated gain parameters. The systems of FIGS. 19A-19D and 20A-20D converge to stability relatively quickly with minimal oscillation. Thus, it can be seen that the system of FIG. 14 provides convergence regardless of the configuration of the contour lines for delta phase and/or auxiliary voltage.

Figure 21:
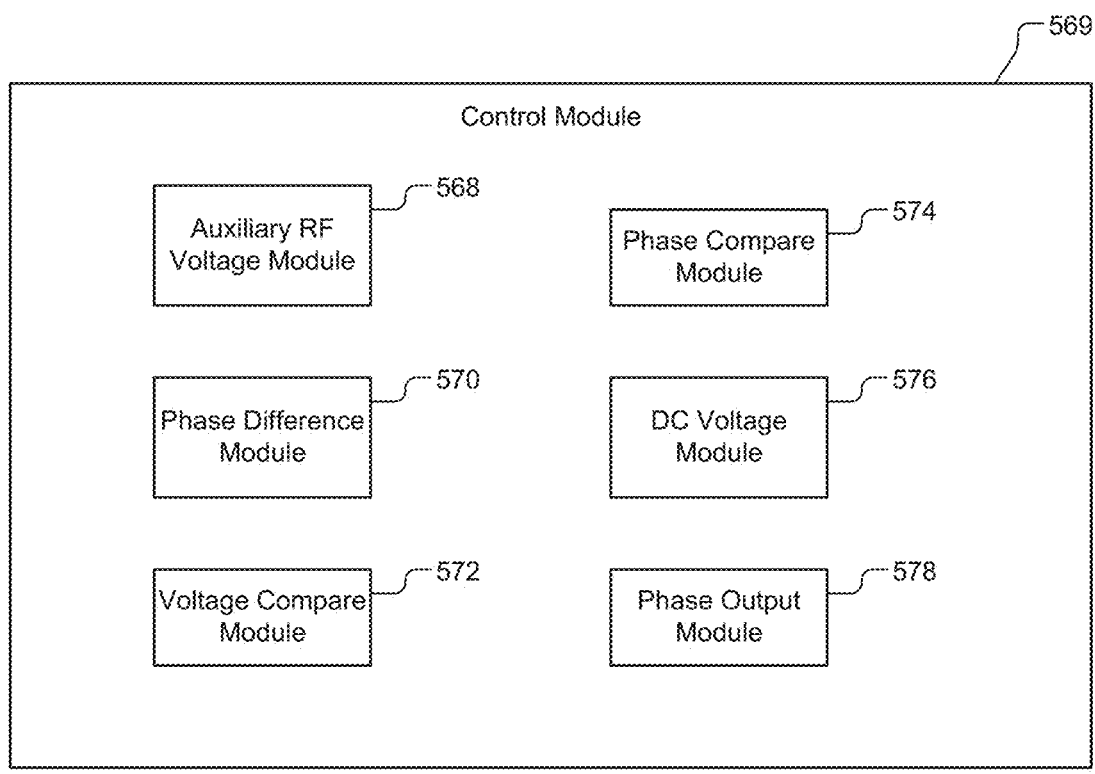
FIG. 21 is a functional block diagram of an example control module in accordance with an embodiment of the present disclosure.

FIG. 21 shows a control module 569. The control module or controller 110 of FIGS. 2-4 may be implemented as control module 569. Control module 569 may include auxiliary RF voltage module 568, phase difference module 570, voltage compare module 572, phase compare module 574, DC voltage module 576, and phase output module 578. In various embodiments, control module 569 includes a processor that executes code associated with the modules 568, 570, 572, 574, 576, and 578. Operation of the modules 568, 570, 572, 574, 576, and 578 is described below with respect to the method of FIG. 22.

Figure 22:
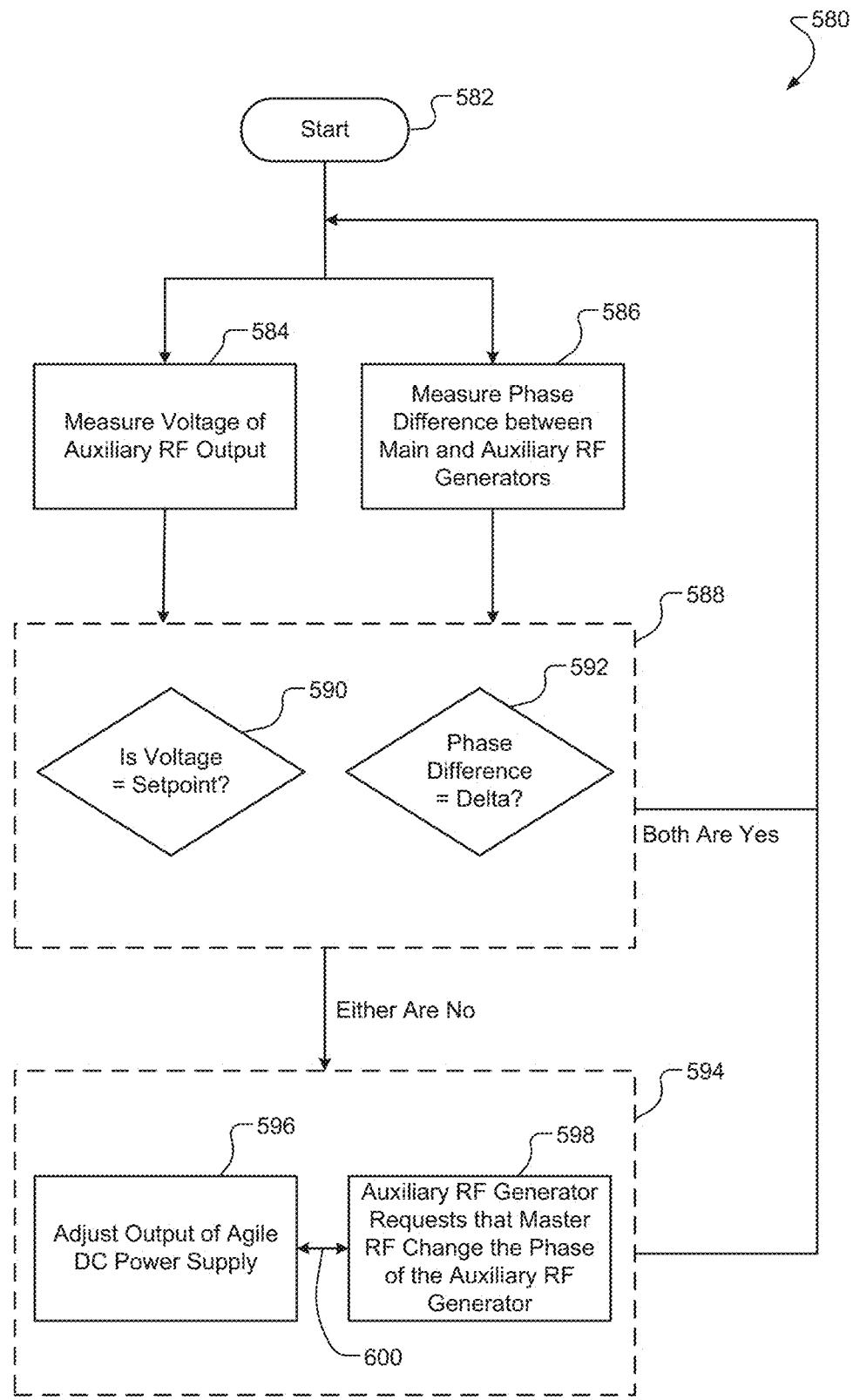
FIG. 22 is a flowchart depicting control of a multi-input, multi-output RF power system.

For further defined structure of the control module of FIGS. 2-4, see below provided method of FIG. 22 and the below provided definition for the term "module". The systems disclosed herein may be operated using numerous methods, an example RF control system method of which is illustrated in FIG. 22. Although the following operations are primarily described with respect to the implementations of FIGS. 2-4, the operations may be easily modified to apply to other implementations of the present disclosure. The operations may be iteratively performed. Although the following operations are shown and primarily described as being performed sequentially, one or more of the following operations may be performed while one or more of the other operations are being performed.

FIG. 22 depicts a flowchart 580 of a multi-input, multi-output control system for controlling, by way of non-limiting example, auxiliary RF generator 14 of RF power system 10 of FIG. 1. The method begins at start block 582 and proceeds to blocks 584 and 586. At block 584, auxiliary RF voltage module 568 of control module 569 measures the voltage output of auxiliary RF generator 14, such as via auxiliary voltage sensor 66. At block 586, phase difference module 570 of control module 569 measures the phase difference between the respective RF output signals of master RF generator 12 and auxiliary RF generator 14. It should be noted that blocks 584 and 586, in various embodiments, can be executed in parallel, as shown in FIG. 22 or, in various other embodiments, can be executed sequentially.

Once the output voltage of auxiliary RF generator 14 and the phase difference between auxiliary RF generator 14 and master RF generator 12 are determined, control proceeds to decision block 588. At decision block 588, two separate decision inputs are considered. At block 590, voltage compare module 572 of control module 569 determines if the measured output voltage is within range of or equal to a predetermined setpoint. At block 592, phase compare module 574 of control module 569 determines if the phase difference is within range of or equal to a predetermined value (Delta). As shown at block 588, if the voltage is equal to a predetermined setpoint and the phase difference is equal to a predetermined difference Delta, control proceeds back to blocks 584 and 586. In other words, no adjustment of the output voltage or phase difference is necessary. Further at block 588, if either the voltage is not equal to a predetermined setpoint or the phase difference is not equal to a predetermined difference Delta, control proceeds to block 594.

Block 594 implements multi-input, multi-output control of both the voltage setpoint of the auxiliary voltage and the phase difference between master RF generator 12 and auxiliary RF generator 14. Thus, two inputs may be adjusted or controlled in response to one or both of the auxiliary voltage not being at a predetermined setpoint or the phase difference not being at a predetermined value Delta. At block 596, DC voltage module 576 of control module 569 generates a control signal to adjust the output of the agile DC power supply, such as shown at item 170 of FIG. 2, in order to vary the output voltage of auxiliary RF generator 14. At block 598, phase output module 578 of control module 569 determines the phase setpoint of auxiliary RF generator in order to adjust the phase difference to a predetermined value Delta. At block 598, phase output module 578 causes auxiliary RF generator 14 to generate a request to master RF generator 12 in order to effect a corresponding adjustment to the phase auxiliary RF generator 14.

Block 594 is configured to demonstrate the interaction between adjusting the output of agile DC power supply to vary the rail voltage $V_{RAIL}$ and adjusting the phase of auxiliary RF generator 14. Link 600 indicates communication between the respective blocks 596, 598. That is, DC voltage module 576 and phase output module 578 communicate. Accordingly, block 594 indicates an implementation of a control such as described with respect to the control system of FIG. 14. Thus, flowchart 580 demonstrates a multi-input, multi-output control of the rail voltage $V_{RAIL}$ via adjusting DC power supply 170 of FIG. 2 and the phase control, such as provided via RF control signal 54.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A RF system comprising:
   a first RF generator having a first digital communication port and connected to a first electrode of a load and generating a first RF signal to the first electrode;
   a second RF generator having a second digital communication port and connected to a second electrode of a load and generating a second RF signal to the second electrode, wherein the first and second RF generators provide a respective RF voltage to the first and second electrodes; and
   a controller for controlling the second RF generator, the controller generating a control signal to at least one of the first RF generator or the second RF generator,
   wherein the first digital communication port and the second digital communication port are connected and the first RF generator and the second RF generator communicate via the first digital communication port and the second digital communication port,
   wherein the second RF generator communicates a request to the first RF generator via the second digital communication port to request adjustment of the second RF signal, and the first RF generator varies a RF control signal applied to the second RF generator to adjust the second RF signal, and
   wherein the first RF generator and the second RF generator operate at substantially a same frequency in accordance with a RF control signal communicated from the first RF generator to the second RF generator.

2. The RF system of claim 1 further comprising a DC power supply providing a DC rail voltage for driving a power amplifier of the second RF generator, wherein the controller varies the DC rail voltage in order to control a RF voltage at the second electrode.

3. The RF system of claim 2 wherein the controller varies a phase of the second RF signal.

4. The RF system of claim 3 wherein the controller determines a phase of the first RF signal and the phase of the second RF signal and controls a phase difference between the first RF signal and the second RF signal, wherein the controller varies the phase of the second RF signal in accordance with the phase difference.

5. The RF system of claim 1 wherein the controller varies a phase of the second RF signal.

6. The RF system of claim 5 wherein the controller determines a phase of the first RF signal and the phase of the second RF signal and determines a phase difference between the first RF signal and the second RF signal, wherein the controller varies the phase of the second RF signal in accordance with the phase difference.

7. The RF system of claim 6 wherein the first RF generator and the second RF generator provide one of a source or bias voltage to the first and second electrodes.

8. The RF system of claim 1 wherein the first RF generator and the second RF generator provide one of a source or bias voltage to the first and second electrodes.

9. The RF system of claim 1 wherein the first RF generator and the second RF generator operate in one of a continuous wave mode of operation or a pulse mode of operation.

10. The RF system of claim 9 wherein in a pulse mode of operation, the first RF generator outputs a pulse synchronization signal to the second RF generator to control pulsing of the second RF generator.

11. The RF system of claim 1, wherein the adjustment is one of amplitude or phase of the second RF signal.

12. The RF system of claim 1 wherein the second RF generator communicates a request to the first RF generator via the second digital communication port to request adjustment of pulsing of the second RF signal, and the first RF generator varies a pulse control signal applied to the second RF generator to adjust pulsing of the second RF signal.

13. The RF system of claim 12 wherein the adjustment is one of pulse repetition rate, power level, or duty cycle.

14. The RF system of claim 1 wherein the second RF generator further comprises:
   a first sensor detecting at least one first electrical characteristic of the first RF signal and generating a first sensor output signal in accordance with the at least one first electrical characteristic; and
   a second sensor detecting at least one second electrical characteristic of the second RF signal and generating a second sensor output signal in accordance with the at least one second electrical characteristic,
   wherein the controller receives the at least one first electrical characteristic and the at least one second electrical characteristic, and the controller determines whether at least one of the second RF signal or a pulsing of a second RF signal requires adjustment and communicates a requested adjustment to the first RF generator.

15. The RF system of claim 1 wherein the second RF generator further comprises:

a first sensor detecting at least one first electrical characteristic of the first RF signal and generating a first sensor output signal in accordance with the at least one first electrical characteristic;
a power amplifier; and
a DC generator configured to output a DC voltage to the power amplifier,
wherein the controller receives the at least one first electrical characteristic, the controller determines a setpoint for the DC generator, and the controller generates a DC control signal that varies in accordance with the setpoint and communicates the DC control signal to the DC generator to vary the DC voltage.

16. The RF system of claim 15 wherein the second RF generator further comprises an inductive clamp circuit arranged in the power amplifier to return energy to one of the DC generator or a DC bus connecting the first RF generator and the second RF generator.

17. The RF system of claim 15 wherein the second RF generator further comprises
an inductive clamp circuit arranged in the power amplifier; and
a variable resistance communicating with power amplifier, the variable resistance dissipating energy communicated by the inductive clamp circuit.

18. The RF system of claim 17 wherein the controller generates a resistance control signal that varies in accordance with a desired energy to be dissipated by the variable resistance.

19. The RF system of claim 18 wherein the resistance control signal is a pulse width modulation signal or a pulse density modulation signal.

20. The RF system of claim 1 wherein the controller is configured to at least one of:
vary a phase of the second RF signal in accordance with a phase difference between the first RF signal and the second RF signal,
vary a DC rail voltage in order to control a RF voltage at the second electrode in accordance with an electrical characteristic of the second RF signal, wherein a DC power supply provides the DC rail voltage for driving a power amplifier of the second RF generator, or
vary a phase of the second RF signal and the DC rail voltage in order to control the RF voltage at the second electrode, wherein a DC power supply provides the DC rail voltage for driving the power amplifier of the second RF generator, in accordance with both the phase difference between first RF signal and the second RF signal and the electrical characteristic of the second RF signal.

21. A RF power system for supplying a first RF power to an electrode in a load, comprising:
a processor; and
a memory, wherein the memory stores instructions executable by the processor and configured to:
determine whether a voltage of the first RF power equals a predetermined power setpoint,
determine whether a phase difference between the first RF power and a second RF power equals a predetermined phase delta, and
control at least one of:
a phase of the first RF power in accordance with the phase difference between the first RF power and a second RF power,
vary a DC rail voltage in order to control a RF voltage of the first RF power in accordance with an electrical characteristic of the first RF power, or
vary a phase of the first RF power and a DC rail voltage in order to control the first RF power in accordance with both the phase difference between first RF power and the second RF power and the electrical characteristic of the first RF power.

22. The RF power system of claim 21 wherein a DC power supply provides the DC rail voltage for driving a power amplifier generating the first RF power.

23. The RF power system of claim 21 wherein the instructions are further configured to generate a request to adjust the phase of the first RF power and wherein the second RF power varies in accordance with a control signal for the first RF power.

24. The RF power system of claim 21 wherein the instructions are further configured to generate a control signal to a variable DC power supply providing the DC rail voltage.

25. The RF power system of claim 24 wherein, the DC rail voltage varies in accordance with the control.

26. A RF system comprising:
a first RF generator connected to a first electrode of a load and generating a first RF signal to the first electrode;
a second RF generator connected to a second electrode of the load and generating a second RF signal to the second electrode;
a controller for controlling the second RF generator, the controller generating a control signal to at least one of the first RF generator or the second RF generator; and
a DC power supply providing a DC rail voltage for driving a power amplifier of the second RF generator, wherein the controller varies the DC rail voltage in order to control a RF voltage at the second electrode,
wherein the first RF generator and the second RF generator operate at substantially a same RF frequency, and
wherein the controller is configured to at least one of:
vary a phase of second RF signal in accordance with a phase difference between the first RF signal and the second RF signal, or
vary a DC rail voltage to control a RF voltage at the second electrode in accordance with an electrical characteristic of the second RF signal, wherein a DC power supply provides the DC rail voltage for driving a power amplifier of the second RF generator, or
vary a phase of the second RF signal and a DC rail voltage to control the RF voltage at the second electrode, wherein a DC power supply provides the DC rail voltage for driving the power amplifier of the second RF generator, in accordance with both the phase difference between first RF signal and the second RF signal and the electrical characteristic of the second RF signal.

27. The RF system of claim 26 wherein the first RF generator and the second RF generator provide one of a source or bias voltage to the first and second electrodes.

28. The RF system of claim 26 wherein the first RF generator and the second RF generator operate in one of a continuous wave mode of operation or a pulse mode of operation.

29. The RF system of claim 28 wherein in a pulse mode of operation, the first RF generator outputs a pulse synchronization signal to the second RF generator to control pulsing of the second RF generator.

30. The RF system of claim 26 further wherein:
the first RF generator includes a first digital communication port; and the second RF generator includes a second digital communication port,
wherein the first digital communication port and the second digital communication port are connected and the first RF generator and the second RF generator communicate via the first digital communication port and the second digital communication port.

31. The RF system of claim 30 wherein the second RF generator communicates a request to the first RF generator via the second digital communication port to request adjustment of the second RF signal, and the first RF generator varies a RF control signal applied to the second RF generator to adjust the second RF signal.

32. The RF system of claim 31, wherein the adjustment is one of amplitude or phase of the second RF signal.

33. The RF system of claim 30 wherein the second RF generator communicates a request to the first RF generator via the second digital communication port to request adjustment of pulsing of the second RF signal, and the first RF generator varies a pulse control signal applied to the second RF generator to adjust pulsing of the second RF signal.

34. The RF system of claim 33 wherein the adjustment is one of pulse repetition rate, power level, or duty cycle.

35. The RF system of claim 26 wherein the second RF generator further comprises:
a first sensor detecting at least one first electrical characteristic of the first RF signal and generating a first sensor output signal in accordance with the at least one first electrical characteristic; and
a second sensor detecting at least one second electrical characteristic of the second RF signal and generating a second sensor output signal in accordance with the at least one second electrical characteristic,
wherein the controller receives the at least one first electrical characteristic and the at least one second electrical characteristic, and the controller determines whether at least one of the second RF signal or a pulsing of a second RF signal requires adjustment and communicates a requested adjustment to the first RF generator.

36. The RF system of claim 26 wherein the second RF generator further comprises:
a first sensor detecting at least one first electrical characteristic of the first RF signal and generating a first sensor output signal in accordance with the at least one first electrical characteristic;
a power amplifier; and
a DC generator configured to output a DC voltage to the power amplifier,
wherein the controller receives the at least one first electrical characteristic, the controller determines a setpoint for the DC generator, and the controller generates a DC control signal that varies in accordance with the setpoint and communicates the DC control signal to the DC generator to vary the DC voltage.

37. The RF system of claim 26 wherein the second RF generator further comprises:
an inductive clamp circuit arranged in the power amplifier; and
a variable resistance communicating with power amplifier, the variable resistance dissipating energy communicated by the inductive clamp circuit.

38. The RF system of claim 37 wherein the controller generates a resistance control signal that varies in accordance with a desired energy to be dissipated by the variable resistance.

39. The RF system of claim 38 wherein the resistance control signal is a pulse width modulation signal or a pulse density modulation signal.

40. The RF system of claim 26 wherein the second RF generator further comprises an inductive clamp circuit arranged in the power amplifier to return energy to one of the DC generator or a DC bus connecting the first RF generator and the second RF generator.

41. A method of operating a RF power system, the method comprising:
generating a first RF signal applied to a first electrode of a load;
generating a second RF signal applied to a second electrode of the load;
providing a DC rail voltage for driving a power amplifier generating the second RF signal and varying the DC rail voltage in order to control a RF voltage at the second electrode; and
at least one of:
varying a phase of the second RF signal in accordance with a phase difference between the first RF signal and the second RF signal,
varying a DC rail voltage to control a RF voltage at the second electrode in accordance with an electrical characteristic of the second RF signal, wherein the DC rail voltage drives a power amplifier generating the second RF signal, or
varying a phase of the second RF signal and the DC rail voltage in order to control the RF voltage at the second electrode, wherein the DC rail voltage powers the power amplifier, in accordance with both the phase difference between first RF signal and the second RF signal and the electrical characteristic of the second RF signal.

42. The method of claim 41 further comprising generating the second RF signal in one of a continuous wave mode of operation or a pulse mode of operation.

43. The method of claim 41 further comprising pulsing the second RF signal in accordance with a pulse control signal to adjust pulsing of the second RF signal.

44. The method of claim 41 further comprising:
detecting at least one first electrical characteristic of the first RF signal and generating a first sensor output signal in accordance with the at least one first electrical characteristic;
detecting at least one second electrical characteristic of the second RF signal and generating a second sensor output signal in accordance with the at least one second electrical characteristic; and
determining whether at least one of the second RF signal or a pulsing of a second RF signal requires adjustment and communicating a requested adjustment to a first RF generator.

45. The method of claim 44 further comprising generating a DC control signal that varies in accordance with a setpoint and communicating the DC control signal to vary the DC rail voltage.

46. The method of claim 41 further comprising:
providing an inductive clamp circuit arranged in the power amplifier generating the second RF signal; and
providing a variable resistance communicating with power amplifier, the variable resistance dissipating energy communicated by the inductive clamp circuit.

47. The method of claim 41 further comprising providing an inductive clamp circuit arranged in the power amplifier generating the second RF signal to return energy to one of a source of the DC rail voltage.

\* \* \* \* \*